(12) United States Patent
Shimamoto et al.

(10) Patent No.: US 9,478,413 B2
(45) Date of Patent: Oct. 25, 2016

(54) METHOD OF MANUFACTURING SEMICONDUCTOR DEVICE, SUBSTRATE PROCESSING METHOD, SUBSTRATE PROCESSING APPARATUS, AND RECORDING MEDIUM

(71) Applicant: Hitachi Kokusai Electric Inc., Tokyo (JP)

(72) Inventors: Satoshi Shimamoto, Toyama (JP); Yoshiro Hirose, Toyama (JP); Atsushi Sano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/351,785

(22) PCT Filed: Sep. 24, 2012

(86) PCT No.: PCT/JP2012/074408
§ 371 (c)(1),
(2) Date: Apr. 14, 2014

(87) PCT Pub. No.: WO2013/054655
PCT Pub. Date: Apr. 18, 2013

(65) Prior Publication Data
US 2014/0235067 A1    Aug. 21, 2014

(30) Foreign Application Priority Data
Oct. 14, 2011  (JP) ................................. 2011-226852

(51) Int. Cl.
*H01L 21/02* (2006.01)
*H01L 21/205* (2006.01)
(Continued)

(52) U.S. Cl.
CPC ......... *H01L 21/02271* (2013.01); *C23C 16/36* (2013.01); *C23C 16/452* (2013.01); *C23C 16/45531* (2013.01); *C23C 16/45542* (2013.01); *C23C 16/45546* (2013.01);
(Continued)

(58) Field of Classification Search
None
See application file for complete search history.

(56) References Cited

U.S. PATENT DOCUMENTS

| 2005/0106858 | A1* | 5/2005 | Cheng et al. ................ 438/643 |
| 2010/0190348 | A1 | 7/2010 | Akae et al. |

(Continued)

FOREIGN PATENT DOCUMENTS

| JP | 2008-244490 A | 9/2008 |
| JP | 2010-183069 A | 8/2010 |

(Continued)

*Primary Examiner* — Calvin Choi
*Assistant Examiner* — Xiaoming Liu
(74) *Attorney, Agent, or Firm* — Volpe and Koenig, P.C.

(57) ABSTRACT

A thin film that has a predetermined composition and containing predetermined elements is formed on a substrate by performing a cycle of steps a predetermined number of times, said cycle comprising: a step wherein a first layer containing the predetermined elements, nitrogen and carbon is formed on the substrate by alternately performing, a predetermined number of times, a process of supplying a first source gas containing a predetermined element and a halogen group to the substrate and a process of supplying a second source gas containing a predetermined element and an amino group to the substrate; a step wherein a second layer is formed by modifying the first layer by supplying an amine-based source gas to the substrate; and a step wherein a third layer is formed by modifying the second layer by supplying a reaction gas that is different from the source gases to the substrate.

6 Claims, 10 Drawing Sheets

(51) Int. Cl.
  *C23C 16/36* (2006.01)
  *C23C 16/455* (2006.01)
  *C23C 16/452* (2006.01)
  *C23C 16/509* (2006.01)

(52) U.S. Cl.
  CPC ...... *C23C 16/45553* (2013.01); *C23C 16/509* (2013.01); *H01L 21/0214* (2013.01); *H01L 21/0228* (2013.01); *H01L 21/02126* (2013.01); *H01L 21/02167* (2013.01); *H01L 21/02211* (2013.01); *H01L 21/02219* (2013.01); *H01L 21/02274* (2013.01)

(56) References Cited

U.S. PATENT DOCUMENTS

| | | |
|---|---|---|
| 2011/0076857 A1 | 3/2011 | Akae et al. |
| 2011/0129616 A1* | 6/2011 | Ingle et al. ............ 427/568 |
| 2013/0078376 A1* | 3/2013 | Higashino et al. ...... 427/255.39 |

FOREIGN PATENT DOCUMENTS

| | | |
|---|---|---|
| JP | 2011-097017 A | 5/2011 |
| JP | 2011-192875 A | 9/2011 |
| WO | 2011/123792 A2 | 10/2011 |
| WO | 2011/125395 A1 | 10/2011 |

* cited by examiner

METHOD OF MANUFACTURING SEMICONDUCTOR DEVICE, SUBSTRATE PROCESSING METHOD, SUBSTRATE PROCESSING APPARATUS, AND RECORDING MEDIUM

FIELD OF THE INVENTION

The present invention relates to a method of manufacturing a semiconductor device including a process of forming a thin film on a substrate, a method of processing a substrate, a substrate processing apparatus, and a recording medium.

BACKGROUND OF THE INVENTION

With miniaturization of transistors, a thin film, such as an insulating film, constituting sidewall spacers (SWS) of a gate electrode, has been increasingly required to be formed at a low temperature and have a low dielectric constant and a low hydrogen fluoride (HF) wet etch rate. To meet these requirements, a silicon carbonitride (SiCN) film obtained by adding carbon (C) to a silicon nitride (SiN) film or a silicon oxycarbonitride (SiOCN) film obtained by adding oxygen (O) to the SiN film may be used as an insulating film. Since these insulating films need high step coverage characteristics, there have been many cases in which the insulating films are formed using an alternate supply method of alternately supplying process gases (for example, refer to Patent Document 1).

RELATED ART DOCUMENT

Patent Document

1. Japanese Patent Application Publication No. 2011-192875

DISCLOSURE OF THE INVENTION

Problems to be Solved by the Invention

To further improve a tolerance of an insulating film such as the above-described SiCN film or SiOCN film to hydrofluoric acid (HF) or further lower a dielectric constant of the insulating film, reducing a nitrogen (N) concentration of the insulating film and increasing a carbon (C) concentration of the insulating film, or increasing an oxygen (O) concentration of the insulating film is effective. However, in a conventional alternate supply method, it has not been easy to form, for example, a thin film in which a C concentration may exceed an N concentration. Also, it has not been easy to appropriately control C and N concentrations of a thin film. Although a drop in film forming temperature is required to form an insulating film constituting sidewall spacers, in a conventional alternate supply method, a film forming temperature is about 600° C. It has not been easy to form a thin film, such as the above-described insulating film, at a low temperature range of, for example, 550° C.

It is a main object of the present invention to provide a method of manufacturing a semiconductor device, a substrate processing method, a substrate processing apparatus, and a recording medium, which may control a composition of a film in a low temperature range and form a high-quality thin film.

Means for Solving the Problems

According to one aspect of the present invention, there is provided a method of manufacturing a semiconductor device, the method including forming a thin film having a predetermined composition containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber; forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

According to another aspect of the present invention, there is provided a method of processing a substrate, the method including forming a thin film having a predetermined composition containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

According to another aspect of the present invention, there is provided a substrate processing apparatus including:

a process chamber configured to accommodate a substrate;

a first source gas supply system configured to supply a first source gas containing a predetermined element and a halogen group to the substrate in the process chamber;

a second source gas supply system configured to supply a second source gas containing the predetermined element and an amino group to the substrate in the process chamber;

a third source gas supply system configured to supply an amine-based source gas to the substrate in the process chamber;

a reactive gas supply system configured to supply a reactive gas different from the first source gas, the second source gas and the amine-based source gas to the substrate in the process chamber; and a controller configured to control the first source gas supply system, the second source gas supply system, the third source gas supply system and the reactive gas supply system to form a thin film having a predetermined composition containing the predetermined element on the substrate by performing a cycle a predetermined number of times, the cycle including: forming a first layer containing the predetermined element, nitrogen and carbon on the substrate by alternately performing a predetermined number of times: supplying the first source gas to the substrate in the process chamber; and supplying the second source gas to the substrate in the process chamber; forming a second layer by modifying the first layer by supplying the amine-based source gas to the substrate in the process chamber; and forming a third layer by modifying the second layer by supplying the reactive gas to the substrate in the process chamber.

According to another aspect of the present invention, there is provided a non-transitory computer-readable recording medium storing a program that causes a computer to perform: forming a thin film having a predetermined composition containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

Effects of the Invention

According to the present invention, a method of manufacturing a semiconductor device, a substrate processing method, a substrate processing apparatus, and a recording medium, which may control a composition of a film and form a high-quality thin film, may be provided.

BRIEF DESCRIPTION OF THE DRAWINGS

FIG. 9A illustrates an example of a sequence of a process of forming a film without using plasma (using a non-plasma process), and FIG. 9B illustrates an example of a sequence of a process of forming a film using plasma.

DETAILED DESCRIPTION OF THE EMBODIMENTS

One embodiment of the present invention will be now described with reference to the accompanying drawings below.

Figure 1:
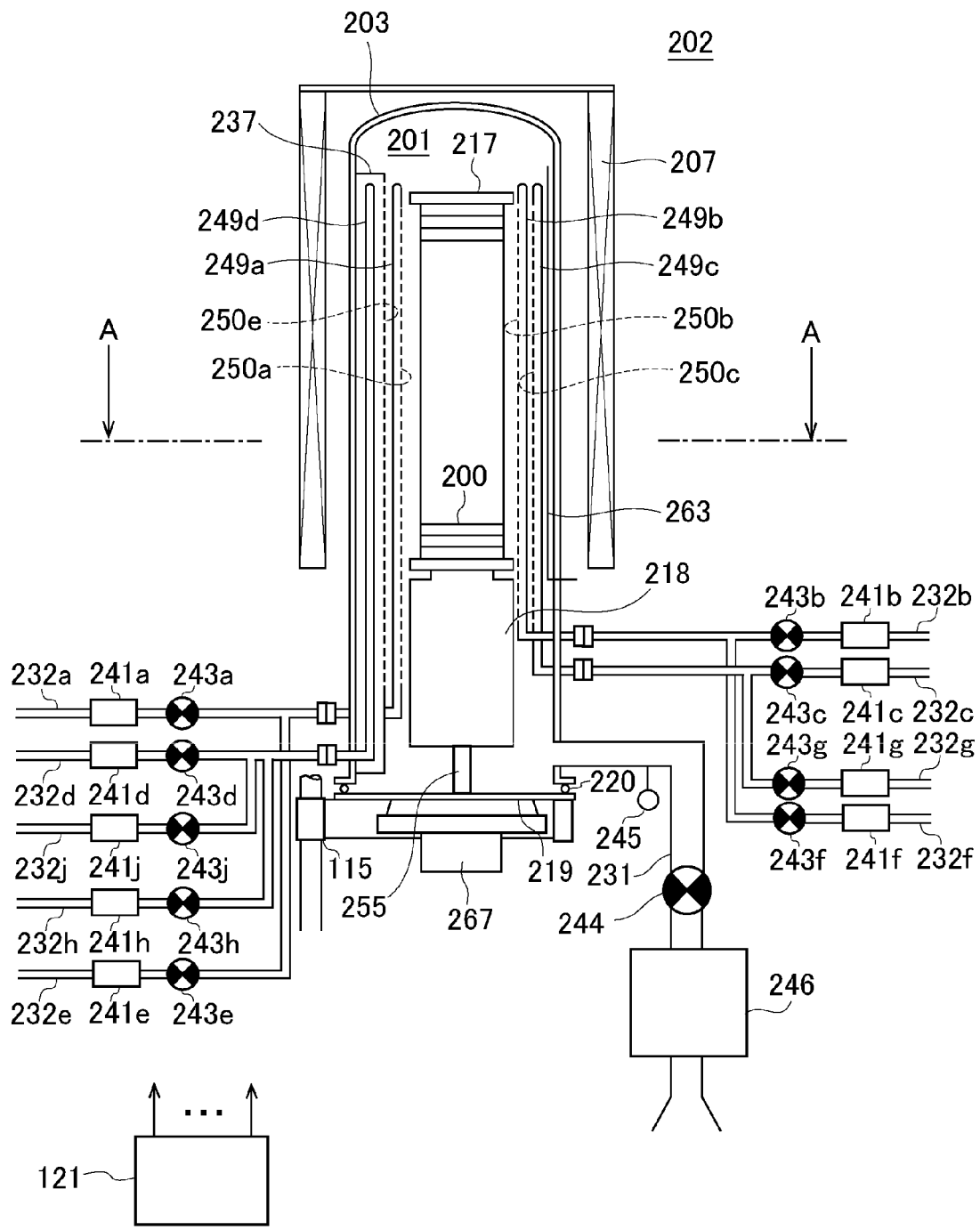
FIG. 1 is a schematic configuration diagram of a longitudinal process furnace of a substrate processing apparatus according to an exemplary embodiment of the present invention, in which a longitudinal cross-sectional view of a portion of the process furnace is illustrated.
Figure 2:
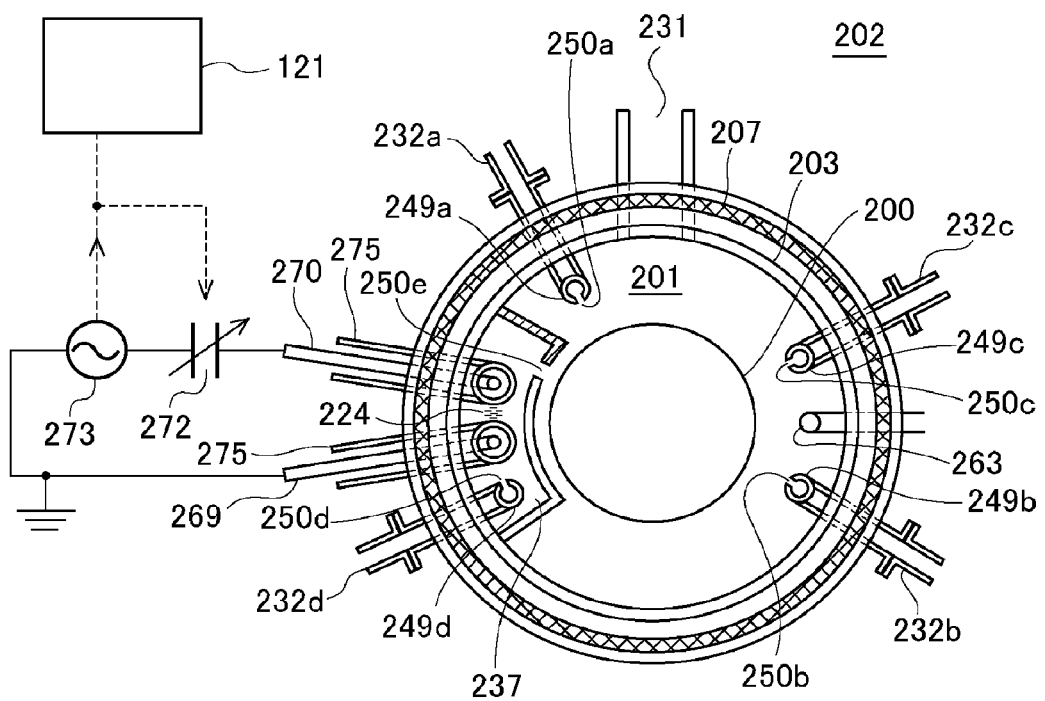
FIG. 2 is a schematic configuration diagram of the longitudinal process furnace of the substrate processing apparatus according to an exemplary embodiment of the present invention, in which a cross-sectional view of the process furnace taken along line A-A of FIG. 1 is illustrated.

FIG. 1 is a schematic configuration diagram of a longitudinal process furnace 202 of a substrate processing apparatus according to an exemplary embodiment of the present invention, in which a longitudinal cross-sectional view of a portion of the process furnace 202 is illustrated. FIG. 2 is a schematic configuration diagram of the longitudinal process furnace 202 of the substrate processing apparatus according to an exemplary embodiment of the present invention, in which a cross-sectional view of the process furnace taken along line A-A of FIG. 1 is illustrated. Also, the present invention is not limited to the substrate processing apparatus according to the present embodiment and is preferably applicable to substrate processing apparatus including a single wafer type process furnace, a hot wall type process furnace, and a cold wall type process furnace.

As shown in FIG. 1, a process furnace 202 includes a heater 207 serving as a heating unit (heating mechanism). The heater 207 has a circular shape and is supported by a heater base (not shown) serving as a retaining plate that is vertically installed. Also, the heater 207 functions as an activation mechanism (excitation unit) configured to activate (excite) a gas with heat as described below.

A reaction tube 203 is installed inside the heater 207 and constitutes a reaction container (processing container) in a concentric circular shape with the heater 207. The reaction tube 203 is formed of a heat-resistant material, for example, quartz ($SiO_2$) or silicon carbide (SiC), and has a cylindrical shape with a closed top end and an open bottom end. A process chamber 201 is formed in a hollow tubular portion of the reaction tube 203, and is configured to accommodate wafers 200 serving as substrates such that the wafers 200 are vertically arranged in a horizontal posture and in multiple stages using a boat 217 that will be described below.

In the process chamber 201, a first nozzle 249a, a second nozzle 249b, a third nozzle 249c, and a fourth nozzle 249d are installed to pass through lower sidewalls of the reaction tube 203. A first gas supply pipe 232a, a second gas supply pipe 232b, a third gas supply pipe 232c, and a fourth gas supply pipe 232d are connected to the first nozzle 249a, the second nozzle 249b, the third nozzle 249c, and the fourth nozzle 249d, respectively. A fifth gas supply pipe 232j is also connected to the fourth gas supply pipe 232d. As described above, the reaction tube 203 is configured to have the four nozzles 249a, 249b, 249c, and 249d and the fifth gas supply pipes 232a, 232b, 232c, 232d, and 232j installed therein and to supply a plurality of gases (here, five types of gases) into the process chamber 201.

Also, a manifold formed of a metal may be installed below the reaction tube 203 to support the reaction tube 203, and the first through fourth nozzles 249a to 249d may be further installed to pass through sidewalls of the manifold. In this case, an exhaust pipe 231 which will be described below may be installed in the manifold formed of a metal. Alternatively, the exhaust pipe 231 may be installed below the reaction tube 203 rather than in the manifold formed of a metal. As described above, a furnace port portion of the process furnace 202 may be formed of a metal and the first through fourth nozzles 249a to 249d may be installed at the furnace port portion formed of a metal.

A mass flow controller (MFC) 241a which is a flow rate controller (flow rate control unit) and a valve 243a which is an opening/closing valve are sequentially installed at the first gas supply pipe 232a in an upstream direction. A first inert gas supply pipe 232e is connected to the first gas supply pipe 232a at a downstream side of the valve 243a. An MFC 241e which is a flow rate controller (flow rate control unit) and a valve 243e which is an opening/closing valve are sequentially installed at the first inert gas supply pipe 232e in the upstream direction. The first nozzle 249a described above is connected to a front end portion of the first gas supply pipe 232a. The first nozzle 249a is installed in an arc-shaped space between inner walls of the reaction tube 203 and the wafers 200 to move upward from lower inner walls of the reaction tube 203 in a direction in which the wafers 200 are stacked. In other words, the first nozzle 249a is installed along a wafer arrangement region in which the wafers 200 are arranged, in a region that horizontally surrounds the wafer arrangement region at sides of the wafer arrangement region. The first nozzle 249a is configured as an L-shaped long nozzle, and includes a horizontal portion passing through lower sidewalls of the reaction tube 203 and a vertical portion vertically moving at least from one end of the wafer arrangement region toward the other end thereof. A plurality of gas supply holes 250a are formed in a side surface of the first nozzle 249a to supply a gas. The gas supply holes 250a open toward a center of the reaction tube 203 to supply a gas toward the wafers 200. The gas supply holes 250a are formed from a lower portion of the reaction tube 203 to an upper portion thereof and each have the same opening area at the same opening pitch.

A first gas supply system mainly includes the first gas supply pipe 232a, the MFC 241a, and the valve 243a. The first gas supply system may further include the first nozzle 249a. A first inert gas supply system mainly includes the first inert gas supply pipe 232e, the MFC 241e, and the valve 243e. The first inert gas supply system may also function as a purge gas supply system.

An MFC 241b which is a flow rate controller (flow rate controller) and a valve 243b which is an opening/closing valve are sequentially installed at the second gas supply pipe 232b in the upstream direction. A second inert gas supply pipe 232f is connected to the second gas supply pipe 232b at a downstream side of the valve 243b. An MFC 241f which is a flow rate controller (flow rate controller) and a valve 243f which is an opening/closing valve are sequentially installed at the second inert gas supply pipe 232f in the upstream direction. The second nozzle 249b described above is connected to a front end portion of the second gas supply pipe 232b. The second nozzle 249b is installed in the arc-shaped space between the inner walls of the reaction tube 203 and the wafers 200 to move upward from the lower inner walls of the reaction tube 203 in the direction in which the wafers 200 are stacked. In other words, the second nozzle 249b is installed along the wafer arrangement region in which the wafers 200 are arranged, in the region that horizontally surrounds the wafer arrangement region at the sides of the wafer arrangement region. The second nozzle 249b is configured as an L-shaped long nozzle, and includes a horizontal portion passing through the lower sidewalls of the reaction tube 203 and a vertical portion vertically moving at least from one end of the wafer arrangement region toward the other end thereof. A plurality of gas supply holes 250b are formed in a side surface of the second nozzle 249b to supply a gas. The gas supply holes 250b open toward the center of the reaction tube 203 to supply a gas toward the wafers 200. The gas supply holes 250b are formed from the lower portion of the reaction tube 203 to the upper portion thereof and each have the same opening area at the same opening pitch.

A second gas supply system mainly includes the second gas supply pipe 232b, the MFC 241b, and the valve 243b. The second gas supply system may further include the second nozzle 249b. A second inert gas supply system mainly includes the second inert gas supply pipe 232f, the MFC 241f, and the valve 243f. The second inert gas supply system may also function as a purge gas supply system.

An MFC 241c which is a flow rate controller (flow rate controller) and a valve 243c which is an opening/closing valve are sequentially installed at the third gas supply pipe 232c in the upstream direction. A third inert gas supply pipe 232g is connected to the third gas supply pipe 232c at a downstream side of the valve 243c. An MFC 241g which is a flow rate controller (flow rate controller) and a valve 243g which is an opening/closing valve are sequentially installed at the third inert gas supply pipe 232g in the upstream direction. The third nozzle 249c described above is connected to a front end portion of the third gas supply pipe 232c. The third nozzle 249c is installed in the arc-shaped space between the inner walls of the reaction tube 203 and the wafers 200 to move upward from the lower inner walls of the reaction tube 203 in the direction in which the wafers 200 are stacked. In other words, the third nozzle 249c is installed along the wafer arrangement region in which the wafers 200 are arranged, in the region that horizontally surrounds the wafer arrangement region at the sides of the wafer arrangement region. The third nozzle 249c is configured as an L-shaped long nozzle, and includes a horizontal portion passing through the lower sidewalls of the reaction tube 203 and a vertical portion vertically moving at least from one end of the wafer arrangement region toward the other end thereof. A plurality of gas supply holes 250c are formed in a side surface of the third nozzle 249c to supply a gas. The gas supply holes 250c open toward the center of the reaction tube 203 to supply a gas toward the wafers 200. The gas supply holes 250c are formed from the lower portion of the reaction tube 203 to the upper portion thereof and each have the same opening area at the same opening pitch.

A third gas supply system mainly includes the third gas supply pipe 232c, the MFC 241c, and the valve 243c. The third gas supply system may further include the third nozzle 249c. A third inert gas supply system mainly includes the third inert gas supply pipe 232g, the MFC 241g, and the valve 243g. The third inert gas supply system may also function as a purge gas supply system.

An MFC 241d which is a flow rate controller (flow rate controller) and a valve 243d which is an opening/closing valve are sequentially installed at the fourth gas supply pipe 232d in the upstream direction. The fifth gas supply pipe 232j is connected to the fourth gas supply pipe 232d at a downstream side of the valve 243d. An MFC 241j which is a flow rate controller (flow rate controller) and a valve 243j which is an opening/closing valve are sequentially installed at the fifth gas supply pipe 232j in the upstream direction. A fourth inert gas supply pipe 232h is connected to the fourth gas supply pipe 232d at a downstream side of a connection point between the fourth gas supply pipe 232d and the fifth gas supply pipe 232j. An MFC 241h which is a flow rate controller (flow rate controller) and a valve 243h which is an opening/closing valve are sequentially installed at the fourth inert gas supply pipe 232h in the upstream direction. The fourth nozzle 249d described above is connected to a front end portion of the fourth gas supply pipe 232d. The fourth nozzle 249d is installed in a buffer chamber 237 serving as a gas dispersion space.

The buffer chamber 237 is installed in the arc-shaped space between the inner walls of the reaction tube 203 and the wafers 200 to move upward from the lower inner walls of the reaction tube 203 in the direction in which the wafers 200 are stacked. In other words, the buffer chamber 237 is installed along the wafer arrangement region in which the wafers 200 are arranged, in the region that horizontally surrounds the wafer arrangement region at the sides of the wafer arrangement region. A plurality of gas supply holes 250e are formed in an end portion of a wall of the buffer chamber 237 adjacent to the wafers 200 to supply a gas. The gas supply holes 250e open toward the center of the reaction tube 203 to supply a gas toward the wafers 200. The gas supply holes 250e are formed from the lower portion of the reaction tube 203 to the upper portion thereof and each have the same opening area at the same opening pitch.

The fourth nozzle 249d is installed in an end portion of the buffer chamber 237 that is at a side opposite to the end portion in which the gas supply holes 250e are installed, to move upward from the lower inner walls of the reaction tube 203 in the direction in which the wafers 200 are stacked. In other words, the fourth nozzle 249d is installed along the wafer arrangement region in which the wafers 200 are arranged, in the region that horizontally surrounds the wafer arrangement region at the sides of the wafer arrangement region. The fourth nozzle 249d is configured as an L-shaped long nozzle, and includes a horizontal portion passing through the lower sidewalls of the reaction tube 203 and a vertical portion vertically moving at least from one end of the wafer arrangement region toward the other end thereof. A plurality of gas supply holes 250d are formed in a side surface of the fourth nozzle 249d to supply a gas. The gas supply holes 250d open toward the center of the reaction tube 203. Like the gas supply holes 250e of the buffer chamber 237, the gas supply holes 250d are formed from the lower portion of the reaction tube 203 to the upper portion thereof. Although the gas supply holes 250d may each have the same opening area at the same opening pitch from an upstream side (lower portion) to the downstream side (upper portion) when a difference in inner pressure between the buffer chamber 237 and the process chamber 201 is low, the gas supply holes 250d may have gradually larger opening areas or gradually smaller opening pitches from the upstream side to the downstream side when the difference in inner pressure between the buffer chamber 237 and the process chamber 201 is high.

In the present embodiment, by controlling the opening area or opening pitch of each of the gas supply holes 250d of the fourth nozzle 249d from an upstream side to a downstream side as described above, gases having different flow velocities and about the same flow rates are emitted from each of the gas supply holes 250d. The gases emitted from each of the gas supply holes 250d are then introduced into the buffer chamber 237, and differences in flow velocity are uniformized in the buffer chamber 237.

In other words, particle velocities of the gases emitted from the respective gas supply holes 250d of the fourth nozzle 249d into the buffer chamber 237 are reduced in the buffer chamber 237 and emitted from the gas supply holes 250e of the buffer chamber 237 into the process chamber 201. Thus, the gases emitted from the respective gas supply holes 250d of the fourth nozzle 249d into the buffer chamber 237 become gases having uniform flow rates and flow velocities when the gases are emitted from the respective gas supply holes 250e of the buffer chamber 237 into the process chamber 201.

A fourth gas supply system mainly includes the fourth gas supply pipe 232d, the MFC 241d, and the valve 243d. The fourth gas supply system may further include the fourth nozzle 249d and the buffer chamber 237. A fifth gas supply system mainly includes the fifth gas supply pipe 232j, the MFC 241j, and the valve 243j. The fifth gas supply system may further include the fourth nozzle 249d and the buffer chamber 237. A fourth inert gas supply system mainly includes the fourth inert gas supply pipe 232h, the MFC 241h, and the valve 243h. The fourth inert gas supply system may also function as a purge gas supply system.

As described above, in the present embodiment, a gas is transferred via the first through fourth nozzles 249a to 249d and the buffer chamber 237 arranged in the arc-shaped space that is a vertically long space defined with the inner walls of the reaction tube 203 and end portions of the stacked wafers 200, a gas is first emitted into the reaction tube 203 near the wafers 200 from the gas supply holes 250a, 250b, 250c, 250d, and 250e open in the first through fourth nozzles 249a to 249d and the buffer chamber 237, respectively, and a gas flows mainly in the reaction tube 203 to be parallel with surfaces of the wafers 200, i.e., in a horizontal direction. Due to the structure described above, a gas may be evenly supplied onto the wafers 200 and a thin film may be formed on the wafers 200 to a uniform thickness. Also, a residual gas remaining after a reaction flows in a direction of an exhaust mechanism, i.e., the exhaust pipe 231 which will be described below, but the direction in which the residual gas flows may be appropriately defined according to the location of the exhaust mechanism and is not limited to the vertical direction.

A chlorosilane-based source gas which is a first source gas containing first source including a specific element and a halogen group (e.g., a first source gas containing at least silicon (Si) and a chloro group) is supplied into the process chamber 201 from the first gas supply pipe 232a via the MFC 241a, the valve 243a, and the first nozzle 249a. Here, the chlorosilane-based source gas means a gas obtained by vaporizing a chlorosilane-based source that is in a liquid state at normal temperature and pressure. Also, the chlorosilane-based source is a silane-based source containing a chloro group, and means a source containing at least silicon (Si) and chlorine (Cl). Here, the chlorosilane-based source may be understood as a type of halide. When the term 'source' is used in the present disclosure, it may be understood as a liquid source in a liquid state, a source gas obtained by vaporizing a liquid source, or both of them. Thus, when the term 'chlorosilane-based source' is used in the present disclosure, it may be understood as a chlorosilane-based source in a liquid state, a chlorosilane-based source in a gas state, or both of them. For example, hexachlorodisilane ($Si_2Cl_6$, abbreviated as HCDS) may be used as the chlorosilane-based source. When a liquid source, such as HCDS, which is in a liquid state at normal temperature and pressure, is used, the liquid source is vaporized using a vaporization system, such as a vaporizer or a bubbler, and supplied as a source gas (HCDS gas).

An aminosilane-based source gas which is a second source containing second source that include a specific element and an amino group (amine group), e.g., a second source gas containing at least silicon (Si) and an amino group, is supplied into the process chamber 201 from the second gas supply pipe 232b via the MFC 241b, the valve 243b, and the second nozzle 249b. Here, the aminosilane-based source gas means a gas obtained by vaporizing an aminosilane-based source that is in a liquid state at normal temperature and pressure. Also, the aminosilane-based source means a silane-based source containing an amino group (a silane-based source containing not only the amino group but also an alkyl group such as a methyl group, an ethyl group, or a butyl group), and a source containing at least silicon (Si), nitrogen (N), and carbon (C). Herein, the aminosilane-based source may be understood as an organic source or an organic aminosilane-based source. Also, when the term 'aminosilane-based source' is used in the present disclosure, it may be understood as an aminosilane-based source in a liquid state, an aminosilane-based source gas in a gas state, or both of them. The aminosilane-based source gas may be, for example, tris(dimethyl amino)silane (SiH[N(CH$_3$)$_2$]$_3$, abbreviated as 3DMAS) gas. When a liquid source, such as 3DMAS, that is in a liquid state at normal temperature and pressure is used, the liquid source is vaporized using a vaporization system such as a vaporizer or a bubbler and is then supplied as a source gas (3DMAS gas).

An amine, i.e., an amine-based source gas, is supplied into the process chamber 201 from the third gas supply pipe 232c via the MFC 241c, the valve 243c, and the third nozzle 249c. Here, the amine-based source gas means a source gas containing an amine group, e.g., a gas obtained by vaporizing an amine, and a source gas containing at least carbon (C), nitrogen (N), and hydrogen (H). The amine-based source gas includes an amine, such as ethylamine, methylamine, propylamine, isopropylamine, butylamine, and isobutylamine. Here, the term "amine" refers collectively to compounds in which a hydrogen (H) atom of ammonia (NH$_3$) is substituted with a hydrocarbon group such as an alkyl group. That is, an amine includes a hydrocarbon group such as an alkyl group. An amine-based source gas may be referred to as a silicon-free gas because the amine-based source gas does not contain silicon (Si), and may be referred to as a silicon/metal-free gas because the amine-based source gas does not contain silicon or a metal. The amine-based source gas is a nitrogen-containing gas, a carbon-containing gas, and a hydrogen-containing gas. Also, the amine-based source gas may be a material including only three elements, i.e., the element carbon (C), the element nitrogen (N), and the element hydrogen (H). When the term 'amine-based source' is used in the present disclosure, it may be understood as an amine-based source in a liquid state, an amine-based source gas in a gas state, or both of them. For example, triethylamine [(C$_2$H$_5$)$_3$N, abbreviated as TEA] may be used as the amine-based source gas. When a liquid source, such as TEA, which is in a liquid state at normal temperature and pressure, is used, the liquid source is vaporized using a vaporization system such as a vaporizer or a bubbler and supplied as a source gas (TEA gas).

A nitriding gas, e.g., a gas containing nitrogen (N) (a nitrogen-containing gas) is supplied into the process chamber 201 from the fourth gas supply pipe 232d via the MFC 241d, the valve 243d, the fourth nozzle 249d, and the buffer chamber 237. The nitrogen-containing gas may be, for example, ammonia (NH$_3$) gas.

An oxidizing gas, e.g., a gas containing oxygen (O) (an oxygen-containing gas) is supplied into the process chamber 201 from the fifth gas supply pipe 232j via the MFC 241j, the valve 243j, the fourth gas supply pipe 232d, the fourth nozzle 249d, and the buffer chamber 237. The oxygen-containing gas may be, for example, oxygen (O$_2$) gas.

For example, nitrogen (N$_2$) gas is respectively supplied into the process chamber 201 from the inert gas supply pipes 232e, 232f, 232g, and 232h via the MFCs 241e, 241f, 241g, and 241h, the valves 243e, 243f, 243g, and 243h, the gas supply pipes 232a, 232b, 232c, and 232d, the gas nozzles 249a, 249b, 249c, and 249d and the buffer chamber 237.

Also, when a gas as described above is supplied from each of these gas supply pipes, a first source gas supply system that supplies the first source gas containing the specific element and the halogen group, i.e., a chlorosilane-based source gas supply system, is configured using the first gas supply system. The chlorosilane-based source gas supply system is also referred to simply as a chlorosilane-based source supply system. Also, a second source gas supply system that supplies the second source gas containing the specific element and the amino group, i.e., an aminosilane-based source gas supply system, is configured using the second gas supply system. The aminosilane-based source gas supply system is also referred to simply as an aminosilane-based source supply system. An amine supply system serving as a third source gas supply system that supplies an amine-based source gas, i.e., an amine-based source gas supply system, is configured using the third gas supply system. The amine-based source gas supply system is also referred to simply as an amine-based source supply system. A nitrogen-containing gas supply system serving as a nitriding gas supply system is configured using the fourth gas supply system. Also, an oxygen-containing gas supply system serving as an oxidizing gas supply system is configured using the fifth gas supply system.

When the chlorosilane-based source gas, the aminosilane-based source gas, and the amine-based source gas are referred to together as a source gas, a source gas supply system is configured by the chlorosilane-based source gas supply system, the aminosilane-based source gas supply system, and the amine-based source gas supply system. Also, the source gas supply system is referred to simply as a source supply system. When the nitrogen-containing gas (nitriding gas) and the oxygen-containing gas (oxidizing gas) are referred to together as a reactive gas, a reactive gas supply system is configured by the nitrogen-containing gas supply system and the oxygen-containing gas supply system. Also, since the amine-based source gas is a nitrogen-containing gas, a carbon-containing gas, and a hydrogen-containing gas as described above, the amine-based source gas may be referred to as a reactive gas.

A first rod electrode 269 serving as a first electrode and a second rod electrode 270 serving as a second electrode, each of which has a thin, long structure as illustrated in FIG. 2, are installed in the buffer chamber 237 from the lower portion of the reaction tube 203 to the upper portion thereof in the direction in which the wafers 200 are stacked. Each of the first rod electrode 269 and the second rod electrode 270 is installed parallel to the fourth nozzle 249d. Each of the first and second rod electrodes 269 and 270 is coated with and protected by an electrode protection pipe 275 which is a protection pipe configured to protect the corresponding electrode from an upper portion of the corresponding electrode to a lower portion thereof. One of the first rod electrode 260 or the second rod electrode 270 is connected to a radio-frequency (RF) power source 273 via a matching unit 272, and the other thereof is connected to an earth which is a reference potential. By applying RF power from the RF power source 273 via the matching unit 272 between the first and second rod electrodes 269 and 279, plasma is generated in a plasma generation region 224 between the first and second rod electrodes 269 and 270. A plasma source serving as a plasma generator (plasma generation unit) mainly includes the first rod electrode 269, the second rod electrode 270, and the electrode protection pipes 275. Also, the plasma source may further include the matching unit 272 and the RF power source 273. The plasma source functions as an activation mechanism (excitation unit) configured to activate (excite) a gas to generate plasma as described below.

The electrode protection pipe 275 is configured to isolate each of the first and second rod electrodes 269 and 270 from an atmosphere of the buffer chamber 237 and insert each of the first and second rod electrodes 269 and 270 into the buffer chamber 237. Here, when an oxygen ($O_2$) concentration in the electrode protection pipe 275 is about equal to an $O_2$ concentration in the outside air [atmosphere], the first and second rod electrodes 269 and 270 respectively inserted in the electrode protection pipes 275 are oxidized with heat generated by the heater 207. For this reason, the insides of the electrode protection pipes 275 are previously filled with an insert gas, such as nitrogen gas, or purged with an inert gas, such as nitrogen gas, using an inert gas purge mechanism so that the $O_2$ concentration of the electrode protection pipes 275 can be reduced to prevent oxidation of the first rod electrode 269 or the second rod electrode 270.

The exhaust pipe 231 is installed at the reaction tube 203 to exhaust an atmosphere in the process chamber 201. A pressure sensor 245 serving as a pressure detector (pressure detection unit) configured to detect pressure in the process chamber 201 is connected to the exhaust pipe 231. A vacuum pump 246 serving as a vacuum exhaust device is connected to the exhaust pipe 231 via an auto pressure controller (APC) valve 244 serving as a pressure adjustor (pressure adjustment unit). Also, the APC valve 244 may be configured to vacuum-exhaust the inside of the process chamber 201 or suspend the vacuum-exhausting by opening/closing the APC valve 244 while the vacuum pump 246 is operated, and to adjust pressure in the process chamber 201 by adjusting a degree of opening of the APC valve 244 while the vacuum pump 246 is operated. An exhaust system mainly includes the exhaust pipe 231, the APC valve 244, and the pressure sensor 245. The exhaust system may further include the vacuum pump 246. The exhaust system is configured to vacuum-exhaust the inside of the process chamber 201 to a desired pressure (degree of vacuum) by adjusting the degree of opening of the APC valve 244 based on pressure information detected by the pressure sensor 245 while operating the vacuum pump 246.

Below the reaction tube 203, a seal cap 219 is installed as a furnace port lid that may air-tightly close a lower end opening portion of the reaction tube 203. The seal cap 219 is configured to come in contact with a lower end of the reaction tube 203 from: a lower portion thereof in a vertical direction. The seal cap 219 is formed of, for example, a metal, such as stainless steel, and has a disk shape. An O-ring 220 serving as a seal member that comes in contact with the lower end of the reaction tube 203 is installed on an upper surface of the seal cap 219. A rotating mechanism 267 that rotates the boat 217 as a substrate retainer (which will be described below) is installed at a side of the seal cap 219 opposite to the process chamber 201. A rotation shaft 255 of the rotating mechanism 267 is connected to the boat 217 while passing through the seal cap 219. The rotating mechanism 267 is configured to rotate the wafers 200 by rotating the boat 217. The seal cap 219 is configured to be vertically moved by a boat elevator 115 that is a lifting mechanism vertically installed outside the reaction tube 203. The boat elevator 115 is configured to load the boat 217 into or unload the boat 217 from the process chamber 201 by moving the seal cap 219 upward/downward. That is, the boat elevator 115 is configured as a transfer device (transfer mechanism) that transfers the boat 217, i.e., the wafers 200, into or out of the process chamber 201.

The boat 217 serving as a substrate supporter is formed of a heat-resistant material, e.g., quartz or silicon carbide, and is configured to support the wafers 200 in a state in which the wafers 200 are arranged in a concentrically multilayered structure in a horizontal posture. Below the boat 217, an insulating member 218 formed of a heat-resistant material, e.g., quartz or silicon carbide, is installed and configured to prevent heat generated from the heater 207 from being transmitted to the seal cap 219. Also, the insulating member 218 may include a plurality of insulating plates formed of a heat-resistant material, e.g., quartz or silicon carbide, and an insulating plate holder that supports the plurality of insulating plates in a multilayered structure in a horizontal posture.

In the reaction tube 203, a temperature sensor 263 is installed as a temperature detector, and is configured to control an amount of current to be supplied to the heater 207 based on temperature information detected by the temperature sensor 263, so that the temperature in the process chamber 201 may have a desired temperature distribution. The temperature sensor 263 has an L-shape similar to the nozzles 249a to 249d, and is installed along an inner wall of the reaction tube 203.

Figure 3:
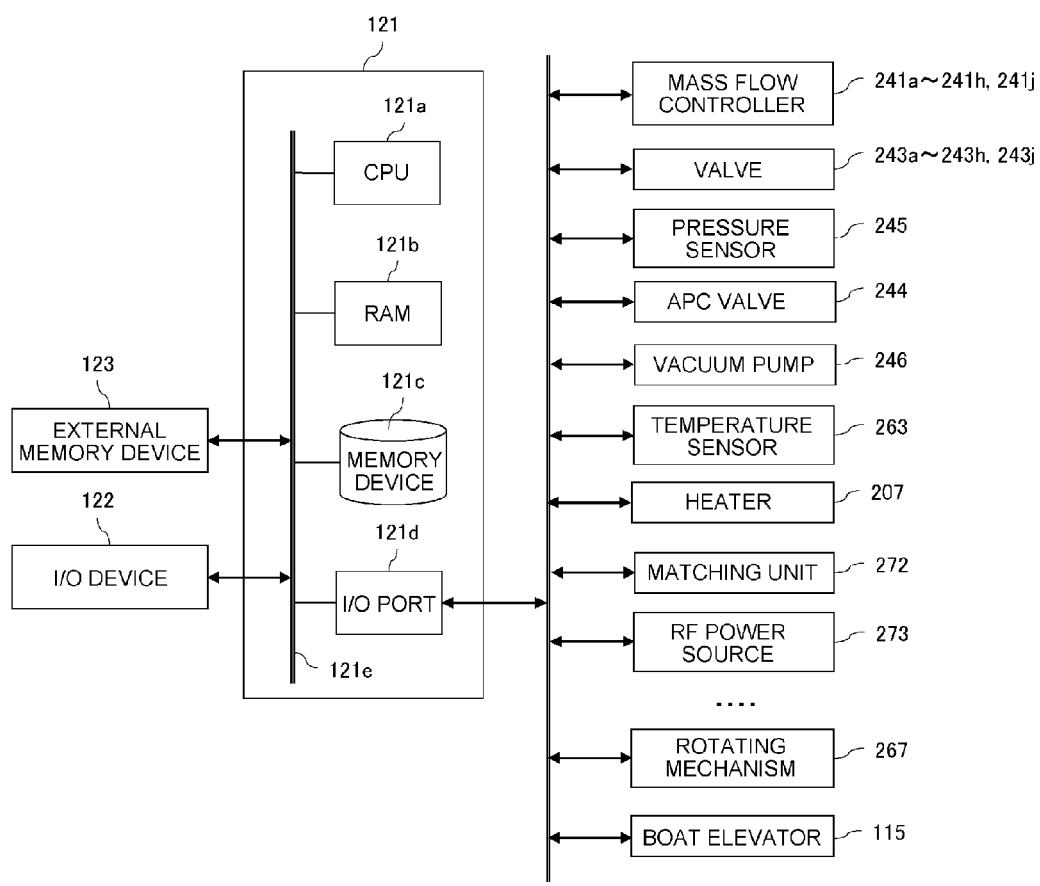
FIG. 3 is a schematic configuration diagram of a controller of a substrate processing apparatus preferably used in the present embodiment.

As illustrated in FIG. 3, a controller 121 which is a control unit (control means) is configured as a computer including a central processing unit (CPU) 121a, a random access memory (RAM) 121b, a memory device 121c, and an input/output (I/O) port 121d. The RAM 121b, the memory device 121c, and the I/O port 121d are configured to exchange data with the CPU 121a via an internal bus 121e. An I/O device 122 configured, for example, as a touch panel or the like is connected to the controller 121.

The memory device 121c includes, for example, a flash memory, a hard disk drive (HDD), or the like. In the memory device 121c, a control program for controlling an operation of a substrate processing apparatus or a process recipe including a sequence or conditions of substrate processing which will be described below is stored to be readable. The process recipe is a combination of sequences of a substrate processing process which will be described below to obtain a desired result when the sequences are performed by the controller 121, and acts as a program. Hereinafter, the process recipe, the control program, etc. will also be referred to together simply as a 'program.' Also, when the term 'program' is used in the present disclosure, it should be understood as including only a process recipe, only a control program, or both of the process recipe and the control program. The RAM 121b is configured as a work area in which a program or data read by the CPU 121a is temporarily stored.

The I/O port 121d is connected to the MFCs 241a to 241h and 241j, the valves 243a to 243h and 243j, the pressure sensor 245, the APC valve 244, the vacuum pump 246, the heater 207, the temperature sensor 263, the rotating mechanism 267, the boat elevator 115, the RF power source 273, and the matching unit 272.

The CPU 121a is configured to read and execute the control program from the memory device 121c and to read the process recipe from the memory device 121c according to a manipulation command received via the I/O device 122. Also, according to the read process recipe, the CPU 121a is configured to control flow rates of various gases via the MFCs 241a to 241h and 241j; control opening/closing of the valves 243a to 243h and 243j; control the degree of pressure by opening/closing the APC valve 244 based on the pressure sensor 245 using the APC valve 244; control temperature using the heater 207 based on the temperature sensor 263; control driving/suspending of the vacuum pump 246; control supply of power using the RF power source 273; control impedance using the matching unit 272; control the rotation and rotation speed of the boat 217 using the rotating mechanism 267; control upward/downward movement of the boat 217 using the boat elevator 115, etc.

The controller 121 is not limited to a dedicated computer and may be configured as a general-purpose computer. For example, the controller 121 according to the present embodiment may be configured by preparing an external memory device 123 storing a program as described above, e.g., a magnetic disk (a magnetic tape, a flexible disk, a hard disk, etc.), an optical disc (a compact disc (CD), a digital versatile disc (DVD), etc.), a magneto-optical (MO) disc, or a semiconductor memory (a Universal Serial Bus (USB) memory, a memory card, etc.), and then installing the program in a general-purpose computer using the external memory device 123. Also, means for supplying a program to a computer are not limited to using the external memory device 123. For example, a program may be supplied to a computer using communication means, e.g., the Internet or an exclusive line, without using the external memory device 123. The memory device 121c or the external memory device 123 may be configured as a non-transitory computer-readable recording medium. Hereinafter, the memory device 121c and the external memory device 123 may also be referred to together simply as a 'recording medium.' Also, when the term 'recording medium' is used in the present disclosure, it may be understood as only the memory device 121c, only the external memory device 123, or both the memory device 121c and the external memory device 123.

Next, an example of a sequence of a process of forming a thin film on a substrate using the process furnace 202 of the substrate processing apparatus described above will be described as a process included in a process of manufacturing a semiconductor device (device). In the following description, operations of constitutional elements of the substrate processing apparatus are controlled by the controller 121.

In the embodiments of the present invention, conditions of supplying a plurality of kinds of gases including a plurality of elements constituting a thin film to be formed are controlled with the object of causing the film to be formed to have a stoichiometric composition or a predetermined composition other than the stoichiometric composition. For example, supply conditions are controlled with the object of causing a stoichiometric content of at least one of the plurality of elements constituting the film to be formed to exceed that of another one thereof. Hereinafter, three sequence examples (first through third sequences) in which a film forming process is performed while controlling contents of the plurality of elements constituting the thin film to be formed, i.e., a content ratio of the thin film, will be described.

In the first sequence of the present embodiment, a thin film having a predetermined composition containing a specific element is formed on a substrate by alternately performing, a predetermined number of times, a process of alternately performing, a predetermined number of times, a process of supplying a first source gas including a specific element and a halogen group to the substrate in a process chamber and a process of supplying a second source gas containing the specific element and an amino group to the substrate in the process chamber to form a first layer containing the specific element, nitrogen (N), and carbon (C) on the substrate; and a process of modifying the first layer by supplying an amine-based source gas to the substrate in the process chamber to form a second layer.

In the second and third sequences of the present embodiment, a thin film having a predetermined composition containing a specific element is formed on a substrate by performing, a predetermined number of times, a cycle including: alternately performing, a predetermined number of times, a process of supplying a first source gas including the specific element and a halogen group to the substrate in a process chamber and a process of supplying a second source gas containing the specific element and an amino group to the substrate in the process chamber to form a first layer containing the specific element, nitrogen, and carbon on the substrate; modifying the first layer by supplying an amine-based source gas to the substrate in the process chamber to form a second layer; and modifying the second layer by supplying a reactive gas other than each of the source gases to the substrate in the process chamber to form a third layer.

(First Sequence)

Figure 4:
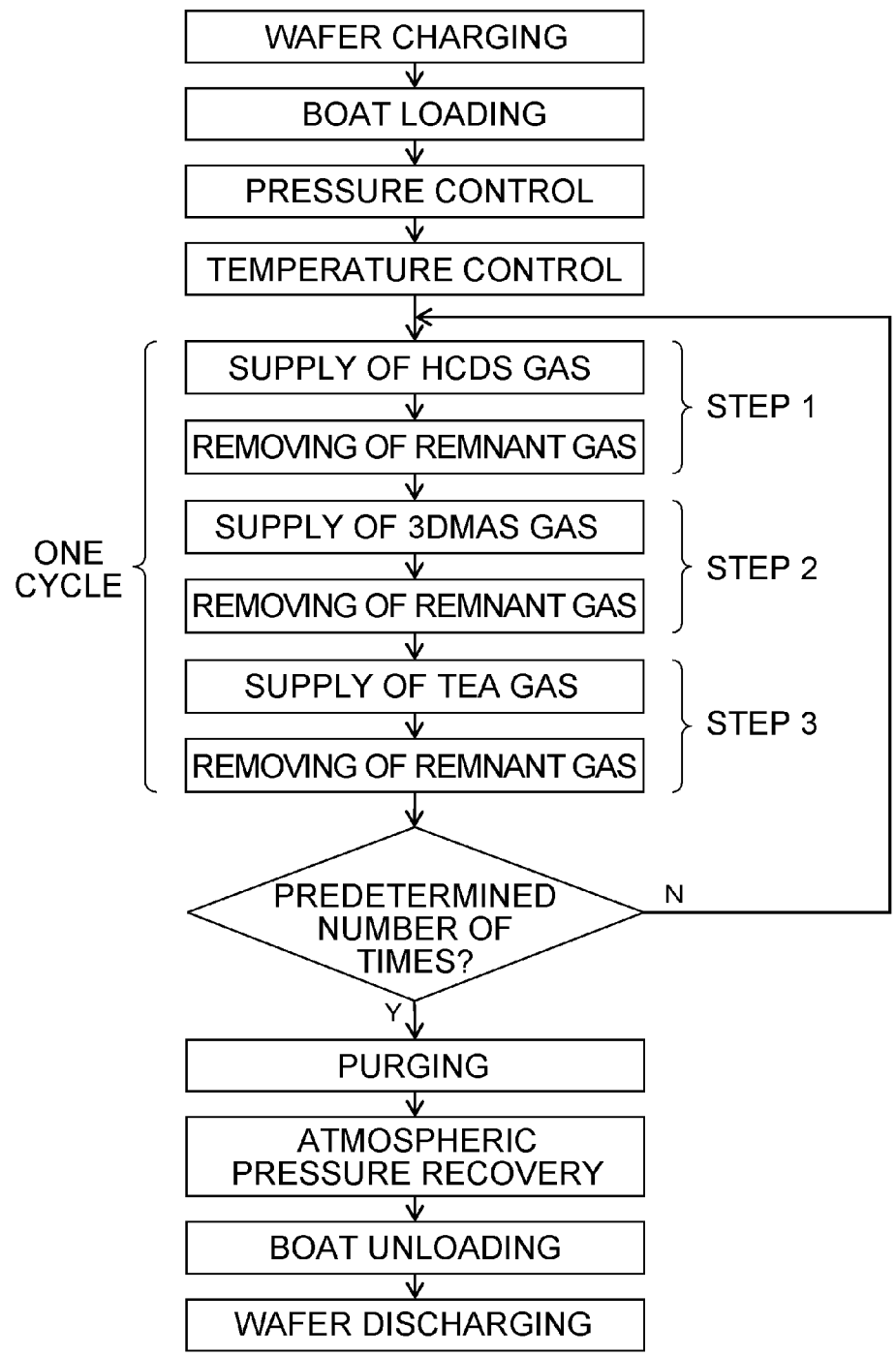
FIG. 4 is a flowchart of a film forming process in a first sequence of the present embodiment.
Figure 7:
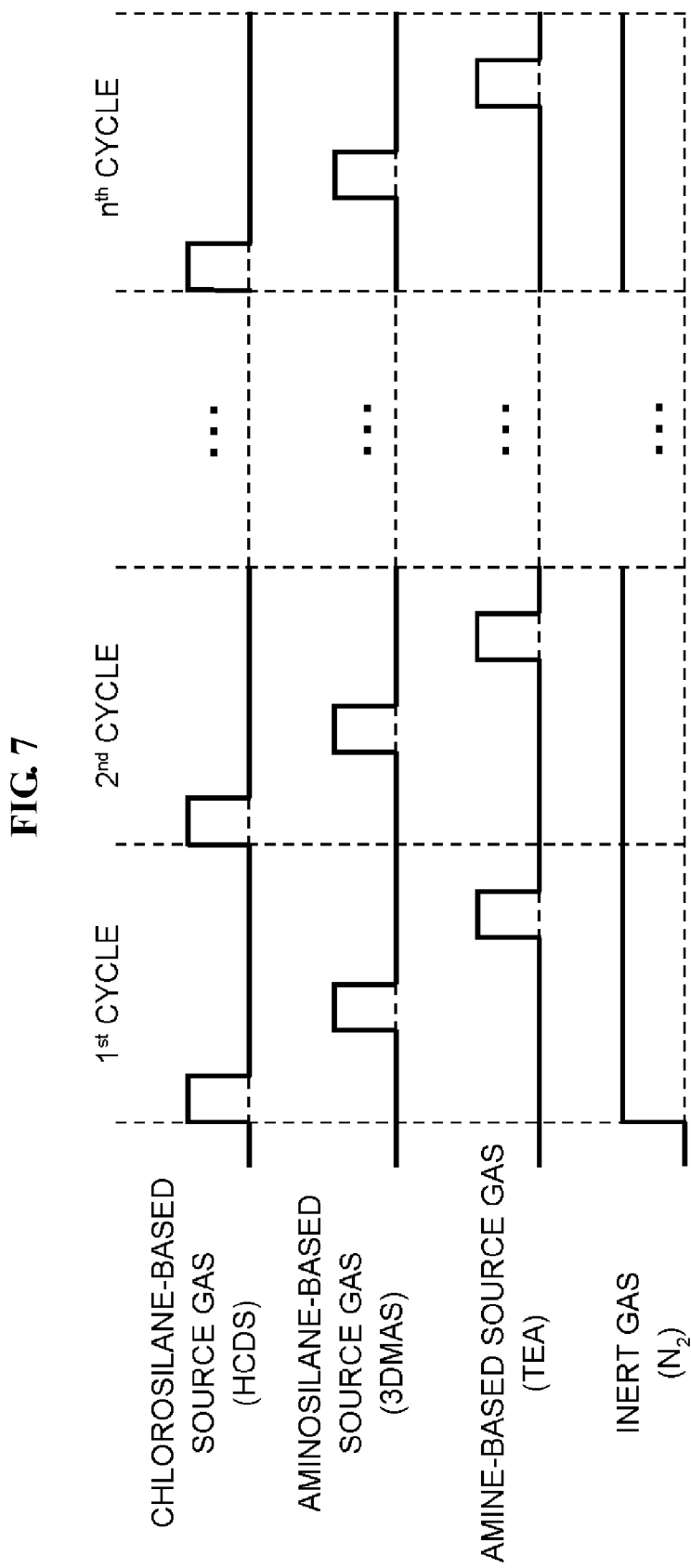
FIG. 7 is a timing chart illustrating gas supply timing in the first sequence of the present embodiment.

First, the first sequence of the present embodiment will be described. FIG. 4 is a flowchart of a film forming process in the first sequence of the present embodiment. FIG. 7 is a timing chart illustrating gas supply timing in the first sequence of the present embodiment.

In the first sequence of the present embodiment, a silicon carbonitride film having a predetermined composition and a predetermined layer thickness is formed on a wafer 200 by alternately performing a process of alternately supplying a chlorosilane-based source and an aminosilane-based source onto a wafer contained in a process chamber 201 to form a first layer containing silicon, nitrogen, and carbon on the wafer 200; and modifying a first layer by supplying an amine-based source to the wafer 200 contained in the process chamber 201 to form a silicon carbonitride layer as a second layer.

Here, alternately supplying the chlorosilane-based source and the aminosilane-based source includes performing a set including a process of supplying one of the chlorosilane-based source and the aminosilane-based source and a process of supplying the other thereof once and repeating the set a plurality of times. That is, it means that the set is performed at least once (a predetermined number of times).

In addition, alternately performing the process of forming the first layer and the process of forming the second layer includes performing a cycle including the process of forming the first layer and the process of forming the second layer once and repeating the cycle a plurality of times. That is, it means performing the cycle at least once (a predetermined number of times).

FIGS. 4 and 7 illustrate an example of a sequence in which the above-described set, i.e., a set including a process of supplying one of a chlorosilane-based source and an aminosilane-based source and a process of supplying the other thereof, is performed once and the above-described cycle, i.e., a cycle including a process of forming a first layer and a process of forming a second layer, is performed a predetermined number of times.

That is, in the film forming sequence described with reference to FIGS. 4 and 7, a silicon carbonitride film having a predetermined composition and a predetermined layer thickness is formed on a wafer 200 by alternately performing, a predetermined number of times, a process of supplying a chlorosilane-based source to the wafer 200 contained in the process chamber 201 and then supplying an aminosilane-based source to form a first layer containing silicon, nitrogen, and carbon; and a process of modifying the first layer by supplying an amine-based source to the wafer 200 contained in the process chamber 201 to form a silicon carbonitride layer as a second layer.

Hereinafter, the first sequence of the present embodiment will be described in detail. Here, an example of formation of a silicon carbonitride film (SiCN film) as an insulating film on a substrate using HCDS gas as a chlorosilane-based source gas, 3DMAS gas as an aminosilane-based source gas, and TEA gas as an amine-based source gas will be described according to the film forming sequence described with reference to FIGS. 4 and 7.

When the term 'wafer' is used in the present disclosure, it should be understood as either the wafer itself, or both the wafer and a stacked structure (assembly) including a layer/film formed on the wafer (i.e., the wafer and the layer/film formed thereon may also be referred to collectively as the 'wafer'). Also, when the expression 'surface of the wafer' is used in the present disclosure, it should be understood as either a surface (exposed surface) of the wafer itself or a surface of a layer/film formed on the wafer, i.e., an uppermost surface of the wafer as a stacked structure.

Thus, in the present disclosure, the expression 'a specific gas is supplied onto a wafer' should be understood to mean that the specific gas is directly supplied onto a surface (exposed surface) of the wafer or that the specific gas is supplied onto a surface of a layer/film on the wafer, i.e., on the uppermost surface of the wafer as a stacked structure. Also, in the present disclosure, the expression 'a layer (or film) is formed on the wafer' should be understood to mean that the layer (or film) is directly formed on a surface (exposed surface) of the wafer itself or that the layer (or film) is formed on the layer/film on the wafer, i.e., on the uppermost surface of the wafer as a stacked structure.

Also, in the present disclosure, the term 'substrate' has the same meaning as the term 'wafer.' Thus, the term 'wafer' may be used interchangeably with the term 'substrate.'

(Wafer Charging and Boat Loading)

When a plurality of wafers 200 are placed in the boat 217 (wafer charging), the boat 217 supporting the plurality of wafers 200 is lifted by the boat elevator 115 and loaded into the process chamber 201 (boat loading), as illustrated in FIG. 1. In this state, the lower end of the reaction tube 203 is air-tightly closed by the seal cap 219 via the O-ring 220.

(Pressure & Temperature Control)

The inside of the process chamber 201 in which the wafers 200 are present is vacuum-exhausted to have a desired pressure (degree of vacuum) by the vacuum pump 246. In this case, the pressure in the process chamber 201 is measured by the pressure sensor 245, and the APC valve 244 is feedback-controlled based on information regarding the measured pressure (pressure control). The vacuum pump 246 is kept operated at least until processing of the wafers 200 is completed. Also, the wafers 200 in the process chamber 201 are heated to a desired temperature by the heater 207. In this case, an amount of current supplied to the heater 207 is feedback-controlled based on temperature information detected by the temperature sensor 263, so that the inside of the process chamber 201 may have a desired temperature distribution (temperature control). The heating of the inside of the process chamber 201 by the heater 207 is continuously performed at least until the processing of the wafers 200 is completed. Then, rotation of the wafers 200 begins by rotating the boat 217 using the rotating mechanism 267 (wafer rotation). Also, the rotation of the boat 217 and the wafers 200 by the rotating mechanism 267 is continuously performed at least until the processing of the wafers 200 is completed.

(Process of Forming a SiCN Film)

Then, the following three steps, i.e., steps 1 to 3, are sequentially performed.

[Step 1] (Supply of HCDS Gas)

The valve 243a of the first gas supply pipe 232a is opened to supply HCDS gas into the first gas supply pipe 232a. The flow rate of the HCDS gas flowing through the first gas supply pipe 232a is controlled by the MFC 241a. The HCDS gas, the flow rate of which is controlled, is supplied into the process chamber 201 via the gas supply holes 250a of the first nozzle 249a, and exhausted from the exhaust pipe 231. In this case, the HCDS gas is supplied onto the wafer 200. At the same time, the valve 243e is opened to supply an inert gas such as $N_2$ gas into the inert gas supply pipe 232e. The flow rate of the $N_2$ gas flowing through the inert gas supply pipe 232e is controlled by the MFC 241e. The $N_2$ gas, the flow rate of which is controlled, is supplied into the process chamber 201 together with the HCDS gas, and exhausted from the exhaust pipe 231.

Also, in this case, in order to prevent the HCDS gas from flowing into the second through fourth nozzles 249b to 249d and the buffer chamber 237, the valves 243f to 243h are opened to supply $N_2$ gas into the second through fourth inert gas supply pipes 232f to 232h. The $N_2$ gas is supplied into the process chamber 201 via the second through fourth gas supply pipes 232b to 232d, the second through fourth nozzles 249b to 249d, and the buffer chamber 237, and exhausted from the exhaust pipe 231.

In this case, the pressure in the process chamber 201 is set to be within, for example, a range of 1 to 13,300 Pa, and preferably a range of 20 to 1,330 Pa, by appropriately controlling the APC valve 244. The supply flow rate of the HCDS gas controlled by the MFC 241a is set, for example, to be within a range of 1 to 1,000 sccm. The supply flow rates of the $N_2$ gas controlled by the MFCs 241e to 241h are set, for example, to be within a range of 100 to 10,000 sccm. A duration for which the HCDS gas is supplied onto the wafer 200, i.e., a gas supply time (gas irradiation time), is set to range, for example, from 1 to 120 seconds, and preferably 1 to 60 seconds. In this case, the temperature of the heater 207 may be set such that the temperature of the wafer 200 is within a range of 250 to 700° C., preferably a range of 300 to 650° C., and more preferably a range of 350 to 600° C. If the temperature of the wafer 200 is less than 250° C., it is difficult for HCDS to be chemically adsorbed onto the wafer 200 and thus a practical film-forming rate may not be achieved. This problem may be overcome when the temperature of the wafer 200 is controlled to be 250° C. or more. Also, when the temperature of the wafer 200 is controlled to be 300° C. or more or 350° C. or more, HCDS may be more sufficiently adsorbed onto the wafer 200 and a more sufficient film-forming rate can be achieved. Also, when the temperature of the wafer 200 is greater than 700° C., a chemical vapor deposition (CVD) reaction becomes stronger (gas-phase reaction is dominant), and thickness uniformity is likely to be degraded and may thus be difficult to control. When the temperature of the wafer 200 is controlled to be 700° C. or less, the thickness uniformity may be prevented from being degraded and thus be controlled. In particular, when the temperature of the wafer 200 is controlled to be 650° C. or less or 600° C. or less, a surface reaction becomes dominant, and the thickness uniformity may be easily achieved and thus be easily controlled. Thus, the temperature of the wafer 200 may be within a range of 250 to 700° C., preferably a range of 300 to 650° C., and more preferably a range of 350 to 600° C.

Under the conditions described above, the HCDS gas is supplied into the process chamber 201 to form a silicon-containing layer on the wafer 200 (an underlying film formed on the wafer 200) to a thickness of less than one atomic layer to several atomic layers. The silicon-containing layer may include an adsorption layer of the HCDS gas, a silicon (Si) layer, or both of these layers. Here, the silicon-containing layer is preferably a layer containing silicon (Si) and chlorine (Cl).

Here, the silicon (Si) layer refers collectively to layers including a continuous layer formed of silicon (Si), a discontinuous layer formed of silicon (Si), and a silicon (Si) thin film formed by the continuous layer and the discontinuous layer. The continuous layer formed of silicon (Si) may also be referred to as a silicon thin film. Also, silicon (Si) used to form the silicon (Si) layer should be understood as including silicon (Si) from which a bond with chlorine (Cl) is not completely broken.

Examples of the adsorption layer of HCDS gas include not only a continuous chemical adsorption layer of gas molecules of the HCDS gas but also a discontinuous chemical adsorption layer of gas molecules of the HCDS gas. That is, the adsorption layer of the HCDS gas includes a chemical adsorption layer formed of HCDS molecules to a thickness of one molecular layer or less than one molecular layer. Also, HCDS ($Si_2Cl_6$) molecules of the adsorption layer of the HCDS gas may have a chemical formula in which a bond between silicon (Si) and chlorine (Cl) is partially broken ($Si_xCl_y$ molecules). That is, the adsorption layer of HCDS gas includes a continuous or discontinuous chemical adsorption layer including $Si_2Cl_6$ molecules and/or $Si_xCl_y$ molecules. A layer having a thickness of less than one atomic layer means a discontinuously formed atomic layer, and a layer having a thickness of one atomic layer means a continuously formed atomic layer. A layer having a thickness of less than one molecular layer means a discontinuously formed molecular layer, and a layer having a thickness of one molecular layer means a continuously formed molecular layer.

Silicon (Si) is deposited on the wafer 200 to form a silicon (Si) layer on the wafer 200 under conditions in which HCDS gas is self-decomposed (pyrolyzed), i.e., conditions causing a pyrolysis reaction of the HCDS gas. The HCDS gas is adsorbed onto the wafer 200 to form an adsorption layer of the HCDS gas on the wafer 200 under conditions in which HCDS gas is not self-decomposed (pyrolyzed), i.e., conditions that do not cause a pyrolysis reaction of the HCDS gas. A film-forming rate may be higher when the silicon (Si) layer is formed on the wafer 200 than when the adsorption layer of the HCDS gas is formed on the wafer 200.

If the thickness of a silicon-containing layer formed on the wafer 200 exceeds a thickness of several atomic layers, the modification action performed in step 3 which will be described below does not have an effect on the entire silicon-containing layer. The silicon-containing layer that may be formed on the wafer 200 may have a minimum thickness of less than one atomic layer. Thus, the silicon-containing layer may be set to have a thickness of less than one atomic layer to several atomic layers. Also, the modification action performed in step 3 (which will be described below) may be relatively increased by controlling the silicon-containing layer to have a thickness not more than one atomic layer, i.e., a thickness of less than one atomic layer or of one atomic layer, thereby reducing a time required to perform the modification action in step 3. Also, a time required to form a silicon-containing layer in Step 1 may be reduced. Accordingly, a process time per cycle may be reduced and a process time to perform a total of cycles may thus be reduced. That is, a film-forming rate may be increased. Also, thickness uniformity may be increased by controlling the silicon-containing layer to have a thickness of one atomic layer or less.

(Removing of Remnant Gas)

After the silicon-containing layer is formed on the wafer 200, the valve 243a of the first gas supply pipe 232a is closed and the supply of the HCDS gas is stopped. In this case, the inside of the process chamber 201 is vacuum-exhausted by the vacuum pump 246 while the APC valve 244 of the exhaust pipe 231 is open, thereby eliminating the HCDS gas (that does not react or that has contributed to the formation of the first layer) remaining in the process chamber 201 from the process chamber 201. In this case, $N_2$ gas is continuously supplied as an inert gas into the process chamber 201 while the valves 243e to 243h are open. The $N_2$ gas acts as a purge gas to increase the effect of eliminating the HCDS gas (that does not react or that has contributed to the formation of the first layer) remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 2 to be performed thereafter will not be badly influenced by the gas. In this case, the flow rate of the $N_2$ gas to be supplied into the process chamber 201 need not be high. For example, the inside of the process chamber 201 may be purged without causing step 2 to be badly influenced by the gas by supplying an amount of a gas corresponding to the capacity of the reaction tube 203 (process chamber 201). As described above, when the inside of the process chamber 201 is not completely purged, a purge time may be reduced and the throughput may be improved. Furthermore, the consumption of the $N_2$ gas may be suppressed to a necessary minimum level.

As the chlorosilane-based source gas, not only hexachlorodisilane ($Si_2Cl_6$, abbreviated as HCDS) gas but also an inorganic source gas, such as tetrachlorosilane, i.e., silicon tetrachloride ($SiCl_4$, abbreviated as STC) gas, trichlorosilane ($SiHCl_3$, abbreviated as TCS) gas, dichlorosilane ($SiH_2Cl_2$, abbreviated as DCS) gas, or monochlorosilane ($SiH_3Cl$, abbreviated as MCS) gas, may be used. As the inert gas, not only $N_2$ gas but also a rare gas, such as Ar gas, He gas, Ne gas, Xe gas, etc., may be used.

[Step 2] (Supply of 3DMAS Gas)

After step 1 ends and the gas remaining in the process chamber 201 is eliminated, the valve 243b of the second gas supply pipe 232b is opened to supply 3DMAS gas into the second gas supply pipe 232b. The flow rate of the 3DMAS gas flowing in the second gas supply pipe 232b is adjusted by the MFC 241b. The 3DMAS gas, the flow rate of which is adjusted, is supplied from the gas supply holes 250b of the second nozzle 249b into the process chamber 201, and exhausted from the exhaust pipe 231. In this case, the 3DMAS gas is supplied onto the wafer 200. At the same time, the valve 243f is opened to supply $N_2$ gas into the inert gas supply pipe 232f. The $N_2$ gas is supplied into the process chamber 201 together with the 3DMAS gas and exhausted from the exhaust pipe 231.

In this case, in order to prevent the 3DMAS gas from flowing into the first, third, and fourth nozzles 249a, 249c, and 249d and the buffer chamber 237, the valves 243e, 243g, and 243h are opened to supply $N_2$ gas into the first, third, and fourth inert gas supply pipes 232e, 232g, and 232h. The N₂ gas is supplied into the process chamber 201 via the first, third, and fourth gas supply pipes 232a, 232c, and 232d and the first, third, and fourth nozzles 249a, 249c, and 249d and the buffer chamber 237 and is then exhausted from the exhaust pipe 231.

In this case, the APC valve 244 is appropriately adjusted to set the pressure in the process chamber 201 to be within a range of, for example, 1 to 13,300 Pa, and preferably a range of 20 to 1,330 Pa, similar to step 1. The supply flow rate of the 3DMAS gas controlled by the MFC 241b is set to be within, for example, a range of 1 to 1,000 sccm. The supply flow rate of the N₂ gas controlled by each of the MFCs 241f, 241e, 241g, and 241h is set to be within, for example, a range of 100 to 10,000 sccm. A duration for which the 3DMAS gas is supplied onto the wafer 200, i.e., a gas supply time (gas irradiation time), is set to be within, for example, a range of 1 to 120 seconds, and preferably a range of 1 to 60 seconds. In this case, the temperature of the heater 207 is set such that the temperature of the wafer 200 falls within, for example, a range of 250 to 700° C., preferably 300 to 650° C., and more preferably a range of 350 to 600° C., similar to step 1.

By supplying 3DMAS gas, the silicon-containing layer formed on the wafer 200 in step 1 and the 3DMAS gas react with each other. Thus, the silicon-containing layer is modified into a first layer containing silicon (Si), nitrogen (N), and carbon (C). The first layer is a layer having a thickness of less than one atomic layer to several atomic layers and containing silicon (Si), nitrogen (N), and carbon (C). Also, the first layer is a layer having relatively high contents of the element Si and the element C, i.e., is both a Si-rich layer and a C-rich layer.

(Removing of Remnant Gas)

After the first layer is formed on the wafer 200, the valve 243b of the second gas supply pipe 232b is closed and the supply of the 3DMAS gas is stopped. In this case, the inside of the process chamber 201 is vacuum-exhausted by the vacuum pump 246 while the APC valve 244 of the exhaust pipe 231 is open, thereby eliminating the 3DMAS gas (that does not react or that contributes to the formation of the first layer) or byproducts remaining in the process chamber 201 from the process chamber 201. In this case, N₂ gas is continuously supplied as an inert gas into the process chamber 201 while the valves 243f, 243e, 243g, and 243h are open. The N₂ gas acts as a purge gas to increase the effect of eliminating the 3DMAS gas (that does not react or that has contributed to formation of the first layer) or by-products remaining in the process chamber 201 from the process chamber 201.

In this case, the gas remaining in the process chamber 201 may not be completely eliminated and the inside of the process chamber 201 may not be completely purged. When a small amount of a gas remains in the process chamber 201, step 3 to be performed thereafter will not be badly influenced by the gas. In this case, the flow rate of the N₂ gas to be supplied into the process chamber 201 need not be high. For example, the inside of the process chamber 201 may be purged without causing step 3 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the N₂ gas may be suppressed to a necessary minimum level.

As the aminosilane-based source gas, not only the 3DMAS gas but also an organic source, such as tetrakis (dimethyl amino)silane ($Si[N(CH_3)_2]_4$, abbreviated as 4DMAS) gas, bis(diethylamino)silane ($Si[N(C_2H_5)_2]_2H_2$, abbreviated as 2DEAS) gas, bis(tertiary-butylamino)silane ($SiH_2[NH(C_4H_9)]_2$, abbreviated as BTBAS) gas, or hexamethyldisilazane [$(CH_3)_3Si$—$NH$—$Si(CH_3)_3$, abbreviated as HMDS] gas, may be used. As the inert gas, not only N₂ gas but also a rare gas, such as Ar gas, He gas, Ne gas, or Xe gas, may be used.

[Step 3] (Supply of TEA Gas)

After step 2 ends and the gas remaining in the process chamber 201 or byproducts are eliminated, the valve 243c of the third gas supply pipe 232c is opened to supply TEA gas into the third gas supply pipe 232c. The flow rate of the TEA gas flowing in the third gas supply pipe 232c is adjusted by the MFC 241c. The TEA gas, the flow rate of which is adjusted, is supplied from the gas supply holes 250c of the third nozzle 249c into the process chamber 201, and exhausted from the exhaust pipe 231. In this case, the TEA gas is supplied onto the wafer 200. At the same time, the valve 243g is opened to supply N₂ gas into the inert gas supply pipe 232g. The N₂ gas is supplied into the process chamber 201 together with the TEA gas, and exhausted from the exhaust pipe 231.

In this case, in order to prevent the TEA gas from flowing into the first, second, and fourth nozzles 249a, 249b, and 249d and the buffer chamber 237, the valves 243e, 243f, and 243h are opened to supply N₂ gas into the first, second, and fourth inert gas supply pipes 232e, 232f, and 232h. The N₂ gas is supplied into the process chamber 201 via the first, second, and fourth gas supply pipes 232a, 232b, and 232d and the first, second, and fourth nozzles 249a, 249b, and 249d and the buffer chamber 237 and is then exhausted from the exhaust pipe 231.

In this case, the APC valve 244 is appropriately adjusted to set the pressure in the process chamber 201 to be within a range of, for example, 1 to 13,300 Pa, and preferably a range of 500 to 6,000 Pa. The supply flow rate of the TEA gas controlled by the MFC 241c is set to be within, for example, a range of 1 to 10,000 sccm. The supply flow rate of the N₂ gas controlled by each of the MFCs 241g, 241e, 241f, and 241h is set to be within, for example, a range of 100 to 10,000 sccm. A duration for which the TEA gas is supplied onto the wafer 200, i.e., a gas supply time (gas irradiation time), is set to be within, for example, a range of 1 to 120 seconds, and preferably a range of 1 to 60 seconds. In this case, the temperature of the heater 207 is set such that the temperature of the wafer 200 falls within, for example, a range of 250 to 700° C., preferably 300 to 650° C., and more preferably 350 to 600° C., similar to step 1 and step 2. The TEA gas is activated (excited) with heat in the third nozzle 249c or the process chamber 201 and supplied onto the wafer 200. Also, when the TEA gas is activated with heat and supplied, a soft reaction may be caused to softly perform a modification action which will be described below.

By supplying TEA gas, at least a portion of the first layer containing Si, N, and C formed on the wafer 200 in step 2 and having relatively high contents of the element Si and the element C reacts with the TEA gas. Thus, the first layer is modified into a second layer. In this case, due to the reaction of the first layer with the TEA gas, a content of the element Si in the first layer is reduced, and contents of the elements C and N in the first layer are increased. Also, due to the reaction, impurities such as chlorine (Cl) are removed from the first layer.

That is, by increasing contents of the elements C and N in the first layer by supplying the thermally activated TEA gas onto the wafer 200, and desorbing impurities such as chlorine (Cl) in the first layer, the first layer may be modified into the second layer. The second layer is a silicon carbonitride (SiCN layer having a thickness of less than one atomic layer to several atomic layers. Also, the second layer is richer in C than the first layer and has a lower content of impurities such as Cl. As described above, modification of the first layer is performed using the TEA gas.

A pressure in the process chamber 201 when the TEA gas is supplied onto the wafer 200 is preferably set to be higher than pressures in the process chamber 201 when HCDS gas and 3DMAS gas are supplied onto the wafer 200 in step 1 and step 2. That is, when the pressures in the process chamber 201 when the HCDS gas and 3DMAS gas are supplied onto the wafer 200 are respectively indicated by $P_1$ and $P_2$ [Pa] and the pressure in the process chamber 201 when the TEA gas is supplied onto the wafer 200 is indicated by $P_3$ [Pa], each of the pressures $P_1$ to $P_3$ is preferably set to satisfy a relationship: $P_3 > P_1$, $P_2$. That is, the pressure in the process chamber 201 when the TEA gas is supplied onto the wafer 200 is preferably highest during steps 1 to 3. By setting the pressure in the process chamber 201 during the supply of the TEA gas to be the highest pressure, the element C may be contained in the SiCN layer at a higher content than the element N, and a SiCN layer richer in C may be formed.

(Removing of Remnant Gas)

Thereafter, the valve 243c of the third gas supply pipe 232c is closed and the supply of the TEA gas is stopped. In this case, the inside of the process chamber 201 is vacuum-exhausted by the vacuum pump 246 while the APC valve 244 of the exhaust pipe 231 is open, thereby eliminating the TEA gas (that does not react or that has contributed to the formation of the second layer) or byproducts remaining in the process chamber 201 from the process chamber 201. In this case, $N_2$ gas is continuously supplied as an inert gas into the process chamber 201 while the valves 243g, 243e, 243f, and 243h are open. The $N_2$ gas acts as a purge gas to increase the effect of eliminating the TEA gas (that does not react or that has contributed to the formation of the second layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1 to be performed thereafter will not be badly influenced by the gas. In this case, the flow rate of the $N_2$ gas to be supplied into the process chamber 201 need not be high. For example, the inside of the process chamber 201 may be purged without causing step 1 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the amine-based source gas, not only triethylamine $[(C_2H_5)_3N$, abbreviated as TEA] but also an ethylamine-based source gas obtained by vaporizing diethylamine $[(C_2H_5)_2NH$, abbreviated as DEA], monoethylamine $(C_2H_5NH_2$, abbreviated as MEA), etc., a methylamine-based source gas obtained by vaporizing trimethylamine $[(CH_3)_3N$, abbreviated as TMA], dimethylamine $[(CH_3)_2NH$, abbreviated as DMA], monomethylamine $(CH_3NH_2$, abbreviated as MMA), etc., a propylamine-based source gas obtained by vaporizing tripropylamine $[(C_3H_7)_3N$, abbreviated as TPA], dipropylamine $[(C_3H_7)_2NH$, abbreviated as DPA], monopropylamine $(C_3H_7NH_2$, abbreviated as MPA), etc., an isopropylamine-based source gas obtained by vaporizing triisopropylamine $([(CH_3)_2CH]_3N$, abbreviated as TIPA), diisopropylamine $([(CH_3)_2CH]_2NH$, abbreviated as DIPA), monoisopropylamine $[(CH_3)_2CHNH_2$, abbreviated as MIPA], etc., a butylamine-based source gas obtained by vaporizing tributylamine $[(C_4H_9)_3N$, abbreviated as TBA], dibutylamine $[(C_4H_9)_2NH$, abbreviated as DBA], monobutylamine $(C_4H_9NH_2$, abbreviated as MBA), etc., or an isobutylamine-based source gas obtained by vaporizing triisobutylamine $([(CH_3)_2CHCH_2]_3N$, abbreviated as TIBA), diisobutylamine $([(CH_3)_2CHCH_2]_2NH$, abbreviated as DIBA), monoisobutylamine $[(CH_3)_2CHCH_2NH_2$, abbreviated as MIBA], etc., may be preferably used. That is, for example, at least one of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[(CH_3)_2CHCH_2]_xNH_{3-x}$ (in formula, x is an integer ranging from 1 to 3) may be preferably used as the amine-based source gas. As the inert gas, not only $N_2$ gas but also a rare gas, such as Ar gas, He gas, Ne gas, or Xe gas, may be used.

A gas containing an organic hydrazine compound, i.e., an organic hydrazine-based gas, may be used as a source gas containing carbon (C) and nitrogen (N) instead of an amine-based source gas. Also, the organic hydrazine-based gas is a gas containing a hydrazine group, such as a gas obtained by vaporizing an organic hydrazine, and a gas containing carbon (C), nitrogen (N), and hydrogen (H). That is, the organic hydrazine-based gas is a Si-free gas and a silicon/metal-free gas. For example, a methylhydrazine-based gas obtained by vaporizing monomethyl hydrazine $[(CH_3)HN_2H_2$, abbreviated as MMH], dimethyl hydrazine $[(CH_3)_2N_2H_2$, abbreviated as DMH], trimethyl hydrazine $[(CH_3)_2N_2(CH_3)H$, abbreviated as TMH], etc., or an ethylhydrazine-based gas obtained by vaporizing ethylhydrazine $[(C_2H_5)HN_2H_2$, abbreviated as EH], etc. may be preferably used as the organic hydrazine-based gas. Also, when an organic hydrazine, for example, MMH, which is in a liquid state at normal temperature and pressure, is used, the organic hydrazine which is in the liquid state is vaporized using a vaporization system such as a vaporizer or a bubbler and supplied as an organic hydrazine-based gas, i.e., a gas containing carbon and nitrogen (MMH gas). A gas containing an organic hydrazine compound may also be referred to simply as an organic hydrazine compound gas or an organic hydrazine gas.

(Performing a Cycle a Predetermined Number of Times)

A silicon carbonitride (SiCN) film having a predetermined composition may be formed on the wafer 200 to a predetermined thickness by performing a cycle including steps 1 to 3 described above at least once (a predetermined number of times). The cycle described above is preferably performed a plurality of times. That is, a thickness of a SiCN layer to be formed per cycle may be set to be less than a desired thickness and the cycle may be performed a plurality of times until the SiCN film may have the desired thickness. Also, the SiCN film may be referred to as a thin film containing silicon (Si), carbon (C), and nitrogen (N).

When the cycle is performed a plurality of times, the expression 'specific gas is supplied onto a wafer 200' in each step to be performed after at least a second cycle should be understood to mean that the specific gas is supplied onto a layer/film on the wafer 200, i.e., on the uppermost surface of the wafer as a stacked structure. Also, in the present disclosure, the expression 'a layer (or film) is formed on the wafer 200' should be understood to mean that the layer (or film) is formed on the layer/film formed on the wafer 200, i.e., on the uppermost surface of the wafer as a stacked structure.

This has been described above, and also applied to modified examples, applied examples, other film forming sequences, and other embodiments which will be described below.

A SiCN film having a predetermined composition may be formed on the wafer 200 to a predetermined thickness by alternately performing, a predetermined number of times, a process of alternately performing, a predetermined number of times, step 1 and step 2 described above and a process of performing step 3. That is, when a set includes step 1 and step 2 described above and a cycle includes a process of performing the set a predetermined number of times and a process of performing step 3, a SiCN film may be formed on the wafer 200 to a predetermined thickness by performing the cycle a predetermined number of times.

By performing, a predetermined number of times, the cycle including the process of performing the set including step 1 and step 2 described above a predetermined number of times and the process of performing step 3, the controllability of a content ratio of the SiCN film may be improved. That is, absolute quantities of the elements Si, N, and C of the first layer may be increased or decreased by increasing or reducing the number of times the set is performed. Then, the first layer in which the absolute quantity of each element may be increased or decreased is modified in step 3. Thus, a content of each element of the SiCN layer may be adjusted by the number of times the set is performed, so that a content of each element of a finally formed SiCN film can be controlled by the number of times the set is performed.

By increasing the number of times the set including step 1 and step 2 is performed, the number of layers of the first layer to be formed per cycle, i.e., the thickness of the first layer to be formed per cycle, may be increased as much as the number of times the set is performed, and it becomes possible to increase a cycle rate (the thickness of the SiCN layer to be formed per unit cycle). Thus, a film forming rate (film thickness of the SiCN film to be formed per unit time) may also be improved.

(Purging and Atmospheric Pressure Recovery)

After the SiCN film having a predetermined composition is formed to the predetermined thickness, an inert gas, such as $N_2$ gas, is supplied into the process chamber 201 and then is exhausted from the exhaust pipe 231. The inside of the process chamber 201 is purged with the inert gas, thereby eliminating a gas or by-products remaining in the process chamber 201 from the process chamber 201 (gas purging). Thereafter, an atmosphere in the process chamber 201 is replaced with the inert gas (inert gas replacement), and the pressure in the process chamber 201 is recovered to normal pressure (atmospheric pressure recovery).

(Boat Unloading and Wafer Discharging)

Then, the seal cap 219 is moved downward by the boat elevator 115 to open the lower end of the reaction tube 203, and the processed wafers 200 are unloaded to the outside of the reaction tube 203 from the lower end of the reaction tube 203 while being supported by the boat 217 (boat unloading). Thereafter, the processed wafers 200 are unloaded from the boat 217 (wafer discharging).

(Second Sequence)

Figure 5:
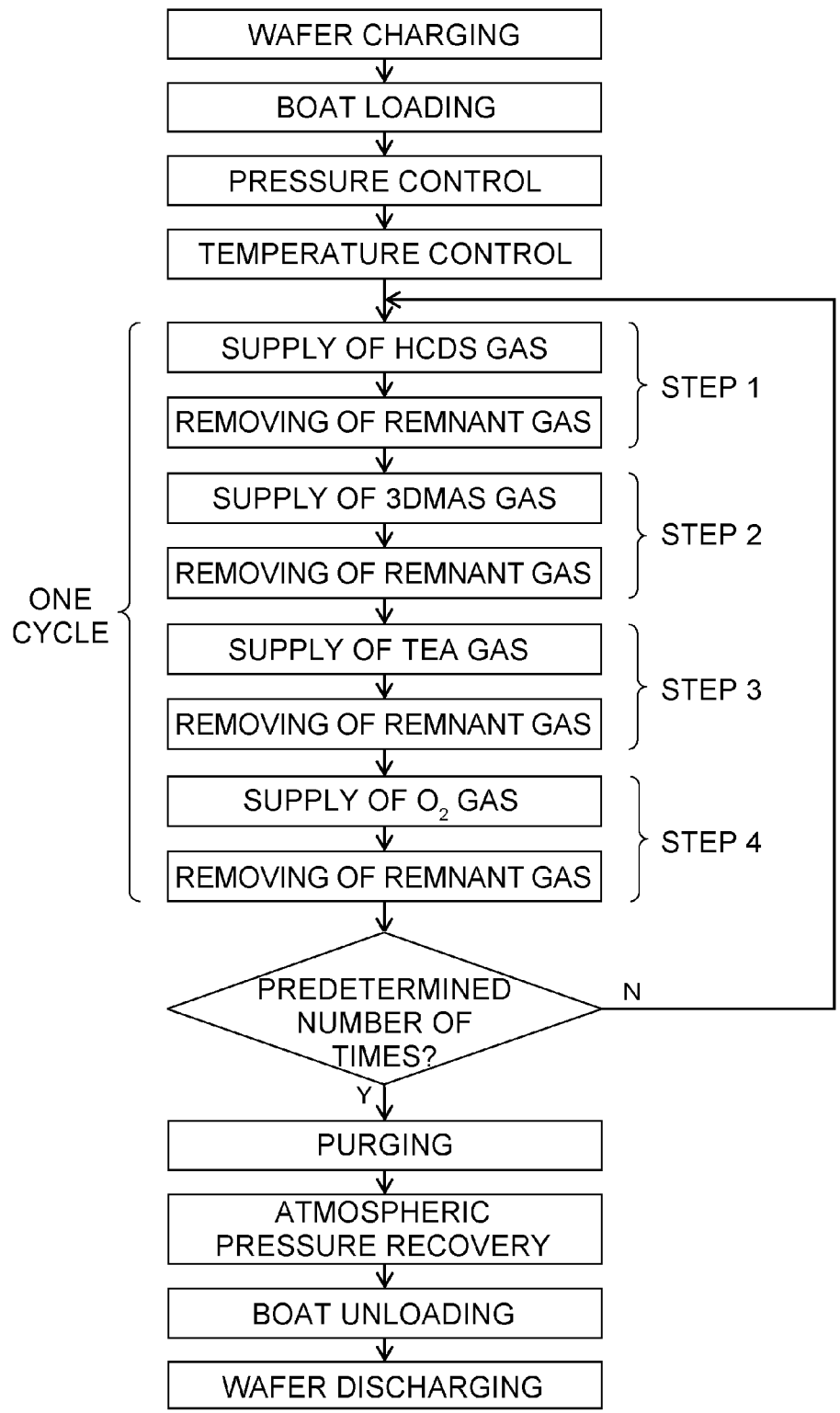
FIG. 5 is a flowchart of a film forming process in a second sequence of the present embodiment.
Figure 8:
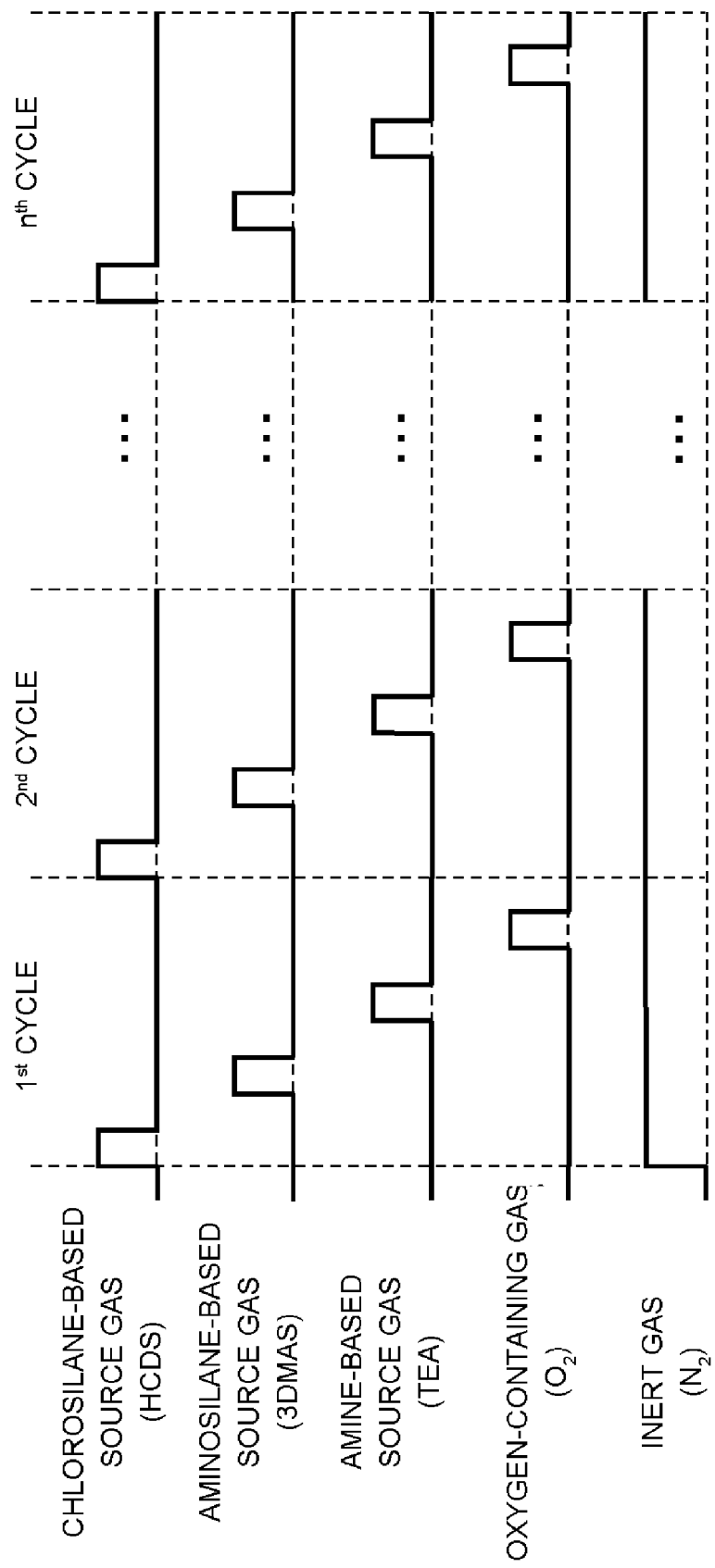
FIG. 8 is a timing chart illustrating gas supply timing in the second sequence of the present embodiment.

Next, the second sequence of the present embodiment will be described. FIG. 5 is a flowchart of a film forming process in the second sequence of the present embodiment. FIG. 8 is a timing chart illustrating gas supply timing in the second sequence of the present embodiment.

In the second sequence of the present embodiment, a silicon oxycarbonitride film or silicon oxycarbide film having a predetermined composition is formed on a wafer 200 to a predetermined thickness by performing, a predetermined number of times, a cycle including: a process of forming a first layer including silicon (Si), nitrogen (N), and carbon (C) on the wafer 200 by alternately supplying a chlorosilane-based source and an aminosilane-based source onto the wafer 200 contained in a process chamber 201; a process of modifying the first layer by supplying an amine-based source onto the wafer 200 contained in the process chamber 201 to form a silicon carbonitride layer as a second layer; and oxidizing the second layer by supplying an oxygen (O)-containing gas (oxidizing gas) activated with heat onto the wafer 200 contained in the process chamber 201 to form a silicon oxycarbonitride layer or silicon oxycarbide layer as a third layer.

Here, alternately supplying the chlorosilane-based source and the aminosilane-based source includes performing a set including a process of supplying one of the chlorosilane-based source and the aminosilane-based source and a process of supplying the other thereof once and repeating the set a plurality of times. That is, it means that the set is performed at least once (a predetermined number of times).

In addition, performing the cycle including the process of forming the first layer, the process of forming the second layer, and the process of forming the third layer a predetermined number of times includes performing the cycle once and repeating the cycle a plurality of times. That is, it means performing the cycle at least once (a predetermined number of times).

FIGS. 5 and 8 illustrate an example of a sequence in which the above-described set, i.e., a set including the process of one of the chlorosilane-based source and the aminosilane-based source and the process of supplying the other thereof, is performed once and the above-described cycle, i.e., a cycle including the process of forming the first layer, the process of forming the second layer, and the process of forming the third layer, is performed a predetermined number of times.

That is, in the film forming sequence described with reference to FIGS. 5 and 8, a silicon oxycarbonitride film or silicon oxycarbide film having a predetermined composition is formed on a wafer 200 to a predetermined thickness by performing, a predetermined number of times, a cycle including: a process of supplying a chlorosilane-based source onto the wafer 200 contained in a process chamber 201 and then supplying an aminosilane-based source to form a first layer containing silicon (Si), nitrogen (N), and carbon (C) on the wafer 200; a process of modifying the first layer by supplying an amine-based source gas onto the wafer 200 contained in the process chamber 201 to form a silicon carbonitride layer as a second layer; and oxidizing the second layer by supplying an oxygen-containing gas activated with heat onto the wafer 200 contained in the process chamber 201 to form a silicon oxycarbonitride layer or silicon oxycarbide layer as a third layer.

Hereinafter, the second sequence of the present embodiment will be described in detail. Here, an example of formation of a silicon oxycarbonitride film (SiOCN film) or silicon oxycarbide film (SiOC film) as an insulating film on a substrate using HCDS gas as a chlorosilane-based source gas, 3DMAS gas as an aminosilane-based source gas, TEA gas as an amine-based source gas, and $O_2$ gas as an oxygen-containing gas will be described according to the film forming sequence described with reference to FIGS. 5 and 8.

The wafer charging process, the boat loading process, the pressure and temperature control process, and the wafer rotation process are performed in the same manner as in the first sequence. Thereafter, four steps which will be described below are sequentially performed.

[Step 1]

Step 1 is performed in the same manner as step 1 of the first sequence. In other words, process conditions, caused reactions, and formed layers in step 1 are the same as those in step 1 of the first sequence 1. That is, in step 1, a silicon (Si)-containing layer is formed on the wafer 200 by supplying HCDS gas into the process chamber 201.

[Step 2]

Step 2 is performed in the same manner as step 2 of the first sequence. In other words, process conditions, caused reactions, and formed layers in step 2 are the same as those in step 2 of the first sequence. That is, in step 2, by supplying 3DMAS gas into the process chamber 201, the silicon-containing layer reacts with 3DMAS gas to form a first layer containing Si, N, and C.

[Step 3]

Step 3 is performed in the same manner as step 3 of the first sequence. In other words, process conditions, caused reactions, and formed layers in step 3 are the same as those in step 3 of the first sequence. That is, in step 3, TEA gas is supplied into the process chamber 201 to cause a reaction of the first layer containing Si, N, and C with the TEA gas. Thus, a second layer (SiCN layer) having a higher content of the element C and a lower content of impurities such as Cl than the first layer is formed.

A pressure in the process chamber 201 when the TEA gas is supplied onto the wafer 200 is preferably set to be higher than pressures in the process chamber 201 when the HCDS gas and 3DMAS gas are supplied onto the wafer 200 in step 1 and step 2, and preferably set to be higher than a pressure in the process chamber 201 when $O_2$ gas is supplied onto the wafer 200 in step 4 which will be described below. Also, the pressure in the process chamber 201 when the $O_2$ gas is supplied onto the wafer 200 in step 4 is preferably set to be higher than the pressures in the process chamber 201 when the HCDS gas and the 3DMAS gas are supplied onto the wafer 200 in step 1 and step 2. The pressure in the process chamber 201 when the TEA gas is supplied onto the wafer 200 is preferably set to be higher than the pressure in the process chamber 201 when the $O_2$ gas is supplied onto the wafer 200 in step 4. That is, when the pressures in the process chamber 201 when the HCDS gas and the 3DMAS gas are respectively supplied onto the wafer 200 are respectively indicated by $P_1$ and $P_2$ [Pa], the pressure in the process chamber 201 when the TEA gas is supplied onto the wafer 200 is indicated by $P_3$ [Pa], and the pressure in the process chamber 201 when the $O_2$ gas is supplied onto the wafer 200 is indicated by $P_4$ [Pa], each of the pressures $P_1$ to $P_4$ is preferably set to satisfy a relationship: $P_3 > P_1, P_2$, more preferably set to satisfy a relationship: $P_3 > P_4$, and most preferably set to satisfy: $P_3 > P_4 > P_1, P_2$. That is, the pressure in the process chamber 201 when the TEA gas is supplied onto the wafer 200 is preferably set to be highest during steps 1 to 4.

By setting the pressure in the process chamber 201 during the supply of the TEA gas to be the highest pressure, the element C may be contained in the second layer (SiCN layer) at a higher content than the element N, and a SiCN layer richer in C may be formed. Thus, after the second layer (SiCN layer) is oxidized in step 4, the element C may be maintained at a higher content than the element N, and a SiOCN layer or SiOC layer having a high C concentration may be formed. That is, a SiOCN film or SiOC film having a high C concentration may be formed. Also, after the second layer (SiCN layer) is oxidized in step 4, the element C may be contained at a higher content than the element O, and a SiOCN layer or SiOC layer having a C concentration higher than an O concentration may be formed. That is, a SiOCN film or SiOC film having a C concentration higher than an O concentration may be formed.

[Step 4] (Supply of $O_2$ Gas)

After step 3 ends and the gas remaining in the process chamber 201 is eliminated, the valve 243*j* of the fifth gas supply pipe 232*j* is opened to supply $O_2$ gas into the fifth gas supply pipe 232*j*. The flow rate of the $O_2$ gas flowing in the fifth gas supply pipe 232*j* is adjusted by the MFC 241*j*. The $O_2$ gas, the flow rate of which is adjusted, is supplied via the buffer chamber 237 from the gas supply holes 250*d* of the fourth nozzle 249*d* into the process chamber 201, and exhausted from the exhaust pipe 231. In this case, the $O_2$ gas is supplied onto the wafer 200. At the same time, the valve 243*h* is opened to supply $N_2$ gas into the inert gas supply pipe 232*h*. The $N_2$ gas is supplied into the process chamber 201 together with the $O_2$ gas and exhausted from the exhaust pipe 231.

In this case, in order to prevent the $O_2$ gas from flowing into the first through third nozzles 249*a* to 249*c*, the valves 243*e*, 243*f*, and 243*g* are opened to supply $N_2$ gas into the first through third inert gas supply pipes 232*e*, 232*f*, and 232*g*. The $N_2$ gas is supplied into the process chamber 201 via the first through third gas supply pipes 232*a* to 232*c* and the first to third nozzles 249*a* to 249*c* and is then exhausted from the exhaust pipe 231.

In this case, the APC valve 244 is appropriately adjusted to set the pressure in the process chamber 201 to be within a range of, for example, 1 to 3,000 Pa. By setting the pressure in the process chamber 201 to be within a relatively high pressure range, $O_2$ gas may be thermally activated (or excited) using a non-plasma process in the fourth nozzle 249*d*, the buffer chamber 237, or the process chamber 201. Also, when the $O_2$ gas is activated with heat and supplied, a soft reaction may be caused to softly perform an oxidation process which will be described below. The supply flow rate of the $O_2$ gas controlled by the MFC 241*j* is set to be within, for example, a range of 100 to 10,000 sccm. The supply flow rate of the $N_2$ gas controlled by each of the MFCs 241*h*, 241*e*, 241*f*, and 241*g* is set to be within, for example, a range of 100 to 10,000 sccm. In this case, a partial pressure of the $O_2$ gas in the process chamber 201 is set to be within a range of, for example, 0.01 to 2,970 Pa. A duration for which the $O_2$ gas activated with heat is supplied onto the wafer 200, i.e., a gas supply time (gas irradiation time), is set to be within, for example, a range of 1 to 120 seconds, and preferably a range of 1 to 60 seconds. In this case, the temperature of the heater 207 is set such that the temperature of the wafer 200 falls within, for example, a range of 250 to 700° C., preferably 300 to 650° C., and more preferably 350 to 600° C., similar to step 1 to step 3.

In this case, gas supplied into the process chamber 201 is $O_2$ gas thermally activated by elevating a pressure of the inside of the process chamber 201, and none of HCDS gas, 3DMAS gas, and TEA gas is supplied into the process chamber 201. Accordingly, the $O_2$ gas does not cause a vapor reaction, and the activated $O_2$ gas reacts with at least a portion of the second layer (SiCN layer) formed on the wafer 200 in step 3. Thus, the second layer is oxidized and modified into a third layer. The third layer is a silicon oxycarbonitride layer (SiOCN layer) or silicon oxycarbide layer (SiOC layer).

By activating $O_2$ gas with heat and supplying the activated $O_2$ gas into the process chamber 201, the second layer may be thermally oxidized and modified (changed) into a SiOCN layer or SiOC layer. In this case, the second layer is modified into the SiOCN layer or SiOC layer while adding the element O to the second layer. Also, due to the thermal oxidation action using the $O_2$ gas, Si—O bonds increase in the second layer, while Si—N bonds, Si—C bonds, and Si—Si bonds are reduced in the second layer, and a content of each of the elements N, C, and Si contained in the second layer is reduced. In this case, by desorbing most of the element N by extending a thermal oxidation time or elevating oxidizing power of the thermal oxidation action using the $O_2$ gas, a content of the element N may be reduced to a level equal to the content of impurities or the element N may be substantially annihilated. That is, the second layer may be modified into a SiOCN layer or SiOC layer while varying a content ratio toward increasing an O concentration and reducing N, C, and Si concentrations. Also, by controlling process conditions, such as a pressure in the process chamber 201 or a gas supply time, a content of the element O (i.e., an O concentration) of the SiOCN layer or SiOC layer may be finely adjusted, and a content ratio of the SiOCN layer or SiOC layer may be controlled more strictly.

It has been shown that the element C is richer than the element N in the first layer formed using steps 1 and 2. Also, the element C is richer in the second layer formed using step 3 than in the first layer. In some experiments, there were cases in which a C concentration became at least twice as high as a N concentration. That is, when the elements C and N in the second layer are desorbed due to energy of oxidized species (thermal oxidation action using $O_2$ gas), before the element N in the second layer is completely desorbed, oxidation is stopped with the element N remaining Thus, the elements C and N remain in the second layer and the second layer is modified into a SiOCN layer. Also, during the desorption of the elements C and N in the second layer due to the energy of oxidized species, when most of the element N is desorbed and the element C remains in the second layer, oxidation is stopped to modify the second layer into a SiOC layer. That is, contents of the elements C and N, i.e., C and N concentrations, may be controlled by controlling a gas supply time (oxidation processing time). Thus, any one of the SiOCN layer and the SiOC layer may be formed by controlling a content ratio. In addition, the contents of the elements C and N, i.e., the C and N concentrations, may be controlled by controlling the oxidizing power of the thermal oxidation of the second layer. In this case, the contents of the elements C and N, i.e., the C and N concentrations, in the SiOCN layer or SiOC layer may be finely adjusted by controlling process conditions such as a pressure in the process chamber 201.

An oxidation reaction of the second layer is preferably not saturated. For example, when the second layer is formed to a thickness of several atomic layers in step 1 through step 3, a portion of the second layer is preferably oxidized. In this case, oxidation is performed under conditions in which the oxidation reaction of the second layer is unsaturated, so as not to oxidize the entire second layer having a thickness of several atomic layers.

In this case, process conditions of step 4 may be set as described above to cause the oxidation reaction of the second layer to be unsaturated, the process conditions of step 4 may be set to be the following process conditions so that the oxidation reaction of the second layer can be easily unsaturated.

Wafer temperature: 500 to 600° C.
Pressure in the process chamber: 133 to 2,666 Pa
$O_2$ gas partial pressure: 33 to 2,515 Pa
$O_2$ gas supply flow rate: 1,000 to 5,000 sccm
$N_2$ gas supply flow rate: 300 to 3,000 sccm
$O_2$ gas supply time: 6 to 60 seconds (Removing of Remnant Gas)

After the third layer is formed on the wafer 200, the valve 243j of the fifth gas supply pipe 232j is closed and the supply of the $O_2$ gas is stopped. In this case, the inside of the process chamber 201 is vacuum-exhausted by the vacuum pump 246 while the APC valve 244 of the exhaust pipe 231 is open, thereby eliminating the $O_2$ gas (that does not react or that has contributed to the formation of the third layer) or byproducts remaining in the process chamber 201 from the process chamber 201. In this case, $N_2$ gas is continuously supplied as an inert gas into the process chamber 201 while the valves 243h, 243e, 243f, and 243g are open. The $N_2$ gas acts as a purge gas to increase the effect of eliminating the $O_2$ gas (that does not react or that has contributed to the formation of the third layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1 to be performed thereafter will not be badly influenced by the gas. In this case, the flow rate of the $N_2$ gas to be supplied into the process chamber 201 need not be high. For example, the inside of the process chamber 201 may be purged without causing step 1 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the oxygen-containing gas, not only the gas obtained by activating $O_2$ gas with heat but also a gas obtained by thermally activating nitrous oxide ($N_2O$) gas, nitric oxide (NO) gas, nitrogen dioxide ($NO_2$) gas, ozone ($O_3$) gas, hydrogen ($H_2$) gas+oxygen ($O_2$) gas, $H_2$ gas+$O_3$ gas, vapor ($H_2O$), carbon monoxide (CO) gas, carbon dioxide ($CO_2$) gas, etc., may be used. As the oxygen-containing gas, a gas obtained by diluting the gases described above with a rare gas, such as Ar gas, He gas, Ne gas, Xe gas, etc., and activating the diluted gases with heat may be used.

(Performing a Cycle a Predetermined Number of Times)

A silicon oxycarbonitride film (SiOCN film) or silicon oxycarbide film (SiOC film) having a predetermined composition may be formed on the wafer 200 to a predetermined thickness by performing a cycle including steps 1 to 4 described above at least once (a predetermined number of times). The cycle described above is preferably performed a plurality of times. That is, a thickness of a SiOCN layer or SiOC layer to be formed per cycle may be set to be less than a desired thickness and the cycle may be performed a plurality of times until the SiOCN or SiOC film may have the desired thickness. The SiOCN film may also be referred to as a thin film containing silicon (Si), oxygen (O), carbon (C), and nitrogen (N). The SiOC film may also be referred to as a thin film containing silicon (Si), oxygen (O), and carbon (C).

A SiOCN film or SiOC film having a predetermined composition may be formed on the wafer 200 to a predetermined thickness by performing, a plurality of times, a cycle including a process of alternately performing, a predetermined number of times, step 1 and step 2 described above, a process of performing step 3, and a process of performing step 4. That is, a process of performing a set including step 1 and step 2 described above a predetermined number of times, a process of performing step 3, and a process of performing step 4 may be included in one cycle, and a SiOCN film or SiOC film may be formed on the wafer 200 to a predetermined thickness by performing the cycle a predetermined number of times.

By performing, a predetermined number of times, the cycle including the process of performing the set including step 1 and step 2 described above a predetermined number of times, the process of performing step 3, and the process of performing step 4, the controllability of a content ratio of the SiOCN film or SiOC film may be improved. That is, absolute quantities of the elements Si, N, and C of the first layer may be increased or decreased by increasing or reducing the number of times the set is performed. Then, the first layer in which the absolute quantity of each element may be increased or decreased is modified in step 3 and step 4. Thus, a content of each element of the SiOCN layer or SiOC layer may be adjusted by the number of times the set is performed, so that a content of each element of a finally formed SiOCN film or SiOC film can be controlled by the number of times the set is performed.

By increasing the number of times the set including step 1 and step 2 is performed, the number of layers of the first layer to be formed per cycle, i.e., the thickness of the first layer to be formed per cycle, may be increased as much as the number of times the set is performed, and it becomes possible to increase a cycle rate (the thickness of the SiOCN layer or SiOC layer to be formed per unit cycle). Thus, a film forming rate (film thickness of the SiOCN film or SiOC film to be formed per unit time) may also be improved.

By performing, a predetermined number of times, a cycle including a process of performing a set including step 1, step 2, and step 3 a predetermined number of times and a process of performing step 4, a SiOCN film or SiOC film may be formed on the wafer 200 to a predetermined thickness.

By performing, a predetermined number of times, the cycle including the process of performing the set including step 1, step 2, and step 3 described above a predetermined number of times and the process of performing step 4, the controllability of a content ratio of the SiOCN film or SiOC film may be improved. That is, absolute quantities of the elements Si, N, and C of the second layer may be increased or decreased by increasing or reducing the number of times the set is performed. Then, the second layer in which the absolute quantity of each element may be increased or decreased is modified in step 4. Thus, a content of each element of the SiOCN layer or SiOC layer may be adjusted by the number of times the set is performed, so that a content of each element of a finally formed SiOCN film or SiOC film can be controlled by the number of times the set is performed.

By increasing the number of times the set including step 1, step 2, and step 3 is performed, the number of layers of the second layer to be formed per cycle, i.e., the thickness of the second layer to be formed per cycle, may be increased as much as the number of times the set is performed, and it becomes possible to increase a cycle rate (the thickness of the SiOCN layer or the SiOC layer to be formed per unit cycle). Thus, a film forming rate (film thickness of the SiOCN film or SiOC film to be formed per unit time) may also be improved.

When a film forming process of forming a SiOCN film or SiOC film having a predetermined composition to a predetermined thickness is performed, a gas purging process, an inert gas replacement process, an atmospheric pressure recovery process, a boat unloading process, and a wafer discharge process are performed in the same manner as in the first sequence.

(Third Sequence)

Figure 6:
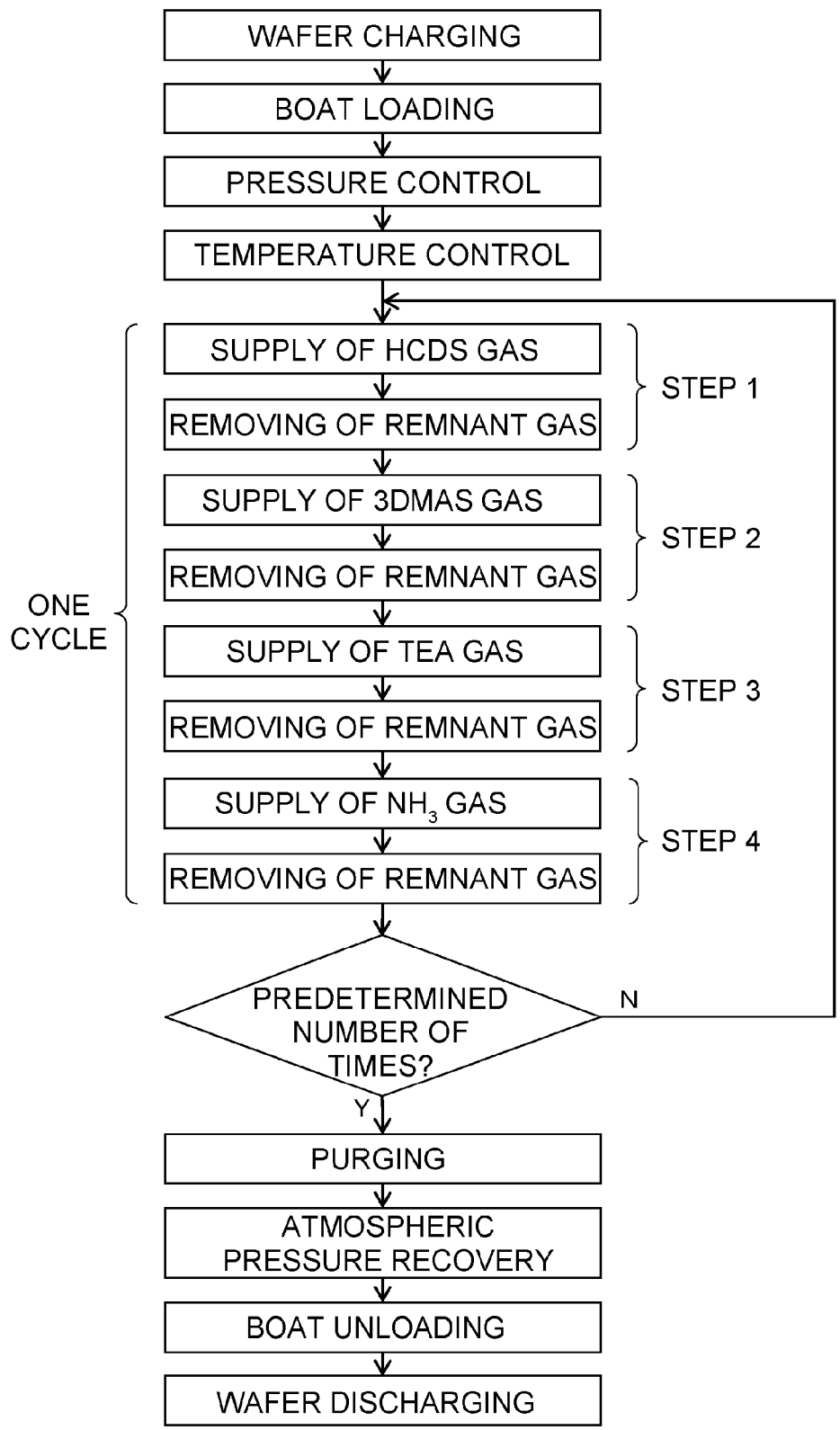
FIG. 6 is a flowchart of a film forming process in a third sequence of the present embodiment.
Figure 9A:
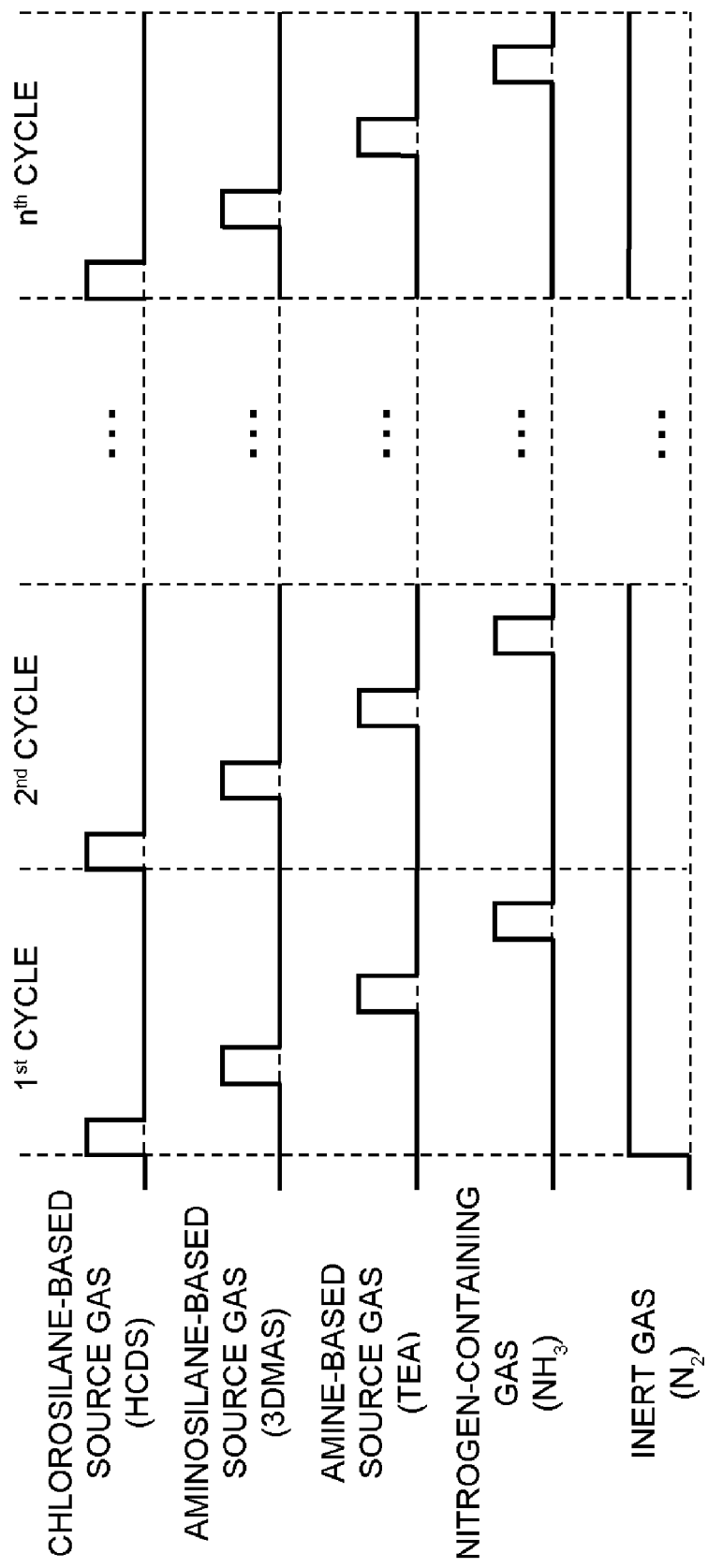
FIGS. 9A and 9B are timing charts illustrating examples of gas supply timing in the third sequence of the present embodiment.
Figure 9B:
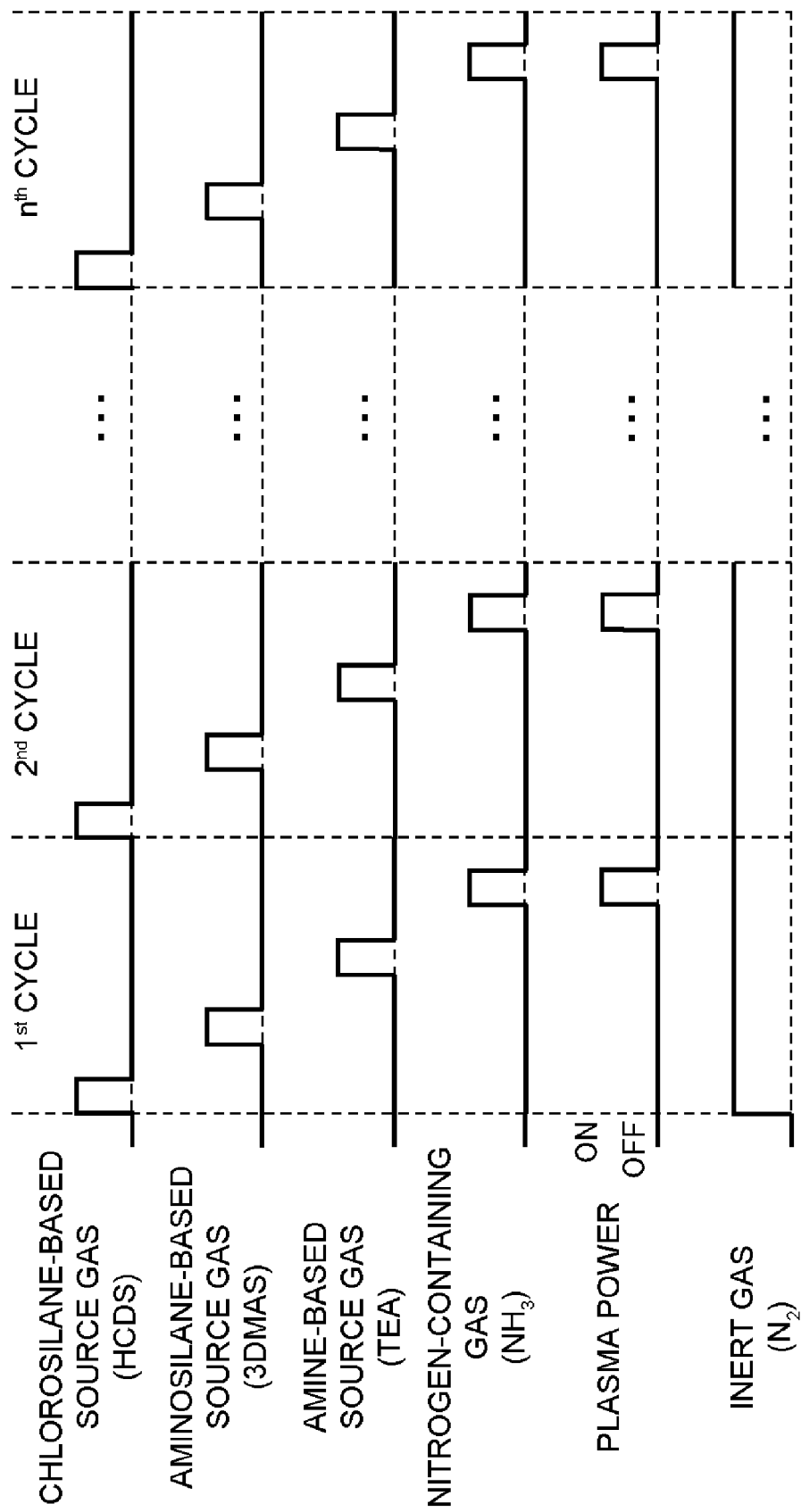

Next, the third sequence of the present embodiment will be described. FIG. 6 is a flowchart of a film forming process in the third sequence of the present embodiment. FIGS. 9A and 9B are timing charts illustrating examples of gas supply timing in the third sequence of the present embodiment. FIG. 9A illustrates an example of a sequence of a process of forming a film without using plasma (using a non-plasma process), and FIG. 9B illustrates an example of a sequence of a process of forming a film using plasma.

In the third sequence of the present embodiment, a silicon carbonitride film having a predetermined composition is formed on a wafer 200 to a predetermined thickness by performing, a predetermined number of times, a cycle including: a process of alternately supplying a chlorosilane-based source and an aminosilane-based source onto the wafer 200 contained in a process chamber 201 to form a first layer containing silicon (Si), nitrogen (N), and carbon (C) on the wafer 200; a process of modifying the first layer by supplying an amine-based source onto the wafer 200 contained in the process chamber 201 to form a silicon carbonitride layer as a second layer; and a process of nitriding the second layer by supplying a nitrogen-containing gas (nitriding gas) activated with heat or plasma onto the wafer 200 contained in the process chamber 201 to form a silicon carbonitride layer as the third layer.

Here, alternately supplying the chlorosilane-based source and the aminosilane-based source includes performing a set including a process of supplying one of the chlorosilane-based source and the aminosilane-based source and a process of supplying the other thereof once and repeating the set a plurality of times. That is, it means that the set is performed at least once (a predetermined number of times).

In addition, performing the cycle including the process of forming the first layer, the process of forming the second layer, and the process of forming the third layer a predetermined number of times includes performing the cycle once and repeating the cycle a plurality of times. That is, it means performing the cycle at least once (a predetermined number of times).

FIGS. 6, 9A, and 9B illustrate an example of a sequence in which the above-described cycle, i.e., the cycle including the process of forming the first layer, the process of forming the second layer, and the process of forming the third layer, is performed a predetermined number of times by performing the above-described set, i.e., the set including the process of supplying one of the chlorosilane-based source and the aminosilane-based source and the process of supplying the other thereof once.

That is, in the film forming sequence described with reference to FIGS. 6 and 8, a silicon carbonitride film having a predetermined composition is formed on a wafer 200 to a predetermined thickness by performing, a predetermined number of times, a cycle including: a process of supplying a chlorosilane-based source onto the wafer 200 contained in a process chamber 201 and then supplying an aminosilane-based source to form a first layer containing silicon, nitrogen, and carbon; a process of modifying the first layer by supplying an amine-based source onto the wafer 200 contained in the process chamber 201 to form a silicon carbonitride layer as a second layer; and a process of modifying the second layer by supplying a nitrogen-containing gas activated with heat or plasma onto the wafer 200 contained in the process chamber 201 to form a silicon carbonitride layer as a third layer.

Hereinafter, the third sequence of the present embodiment will be described in detail. Here, an example of formation of a silicon carbonitride film (SiCN film) as an insulating film on a substrate using HCDS gas as a chlorosilane-based source gas, 3DMAS gas as an aminosilane-based source gas, TEA gas as an amine-based source gas, and $NH_3$ gas as a nitrogen-containing gas will be described according to the sequence described with reference to FIGS. 6 and 8.

A wafer charging process, a boat loading process, a pressure and temperature control process, and a wafer rotation process are performed in the same manner as in the first sequence. Thereafter, four steps which will be described below are sequentially performed.

[Step 1]

Step 1 is performed in the same manner as step 1 of the first sequence. In other words, process conditions, caused reactions, and formed layers in step 1 are the same as those in step 1 of the first sequence 1. That is, in step 1, a silicon-containing layer is formed on the wafer 200 by supplying HCDS gas into the process chamber 201.

[Step 2]

Step 2 is performed in the same manner as step 2 of the first sequence. In other words, process conditions, caused reactions, and formed layers in step 2 are the same as those in step 2 of the first sequence. That is, in step 2, by supplying 3DMAS gas into the process chamber 201, the silicon-containing layer reacts with 3DMAS gas to form a first layer containing Si, N, and C.

[Step 3]

Step 3 is performed in the same manner as step 3 of the first sequence. In other words, process conditions, caused reactions, and formed layers in step 3 are the same as those in step 3 of the first sequence 1. That is, in step 3, by supplying TEA gas into the process chamber 201, a first layer containing Si, N, and C and a second layer (SiCN layer) having a higher content of the element C and a lower content of impurities such as chlorine (Cl) than the first layer due to a reaction of the first layer with the TEA gas are formed.

A pressure in the process chamber 201 when the TEA gas is supplied onto the wafer 200 is preferably set to be higher than pressures in the process chamber 201 when HCDS gas and 3DMAS gas are supplied onto the wafer 200 in step 1 and step 2, and preferably set to be higher than a pressure in the process chamber 201 when $NH_3$ gas is supplied onto the wafer 200 in step 4 which will be described below. The pressure in the process chamber 201 when the $NH_3$ gas is supplied onto the wafer 200 in step 4 is preferably set to be higher than the pressures in the process chamber 201 when the HCDS gas and the 3DMAS gas are supplied onto the wafer 200 in step 1 and step 2, and the pressure in the process chamber 201 when the TEA gas is supplied onto the wafer 200 is preferably set to be higher than the pressure in the process chamber 201 when the $NH_3$ gas is supplied onto the wafer 200 in step 4. That is, when the pressures in the process chamber 201 when the HCDS gas and the 3DMAS gas are supplied onto the wafer 200 are respectively indicated by $P_1$ and $P_2$ [Pa], the pressure in the process chamber 201 when the TEA gas is supplied onto the wafer 200 is indicated by $P_3$ [Pa], and the pressure in the process chamber 201 when the $NH_3$ gas is supplied onto the wafer 200 is indicated by $P_4$ [Pa], each of the pressures $P_1$ to $P_4$ is preferably set to satisfy a relationship: $P_3 > P_1, P_2$, more preferably set to satisfy a relationship: $P_3 > P_4$, and most preferably set to satisfy a relationship: $P_3 > P_4 > P_1, P_2$. That is, the pressure in the process chamber 201 when the TEA gas is supplied onto the wafer 200 is preferably set to be highest during step 1, step 2, step 3, and step 4.

By setting the pressure in the process chamber 201 during the supply of the TEA gas to be the highest pressure, the element C may be contained in the second layer (SiCN layer) at a higher content than the element N, and a SiCN layer richer in C may be formed. Thus, after the second layer (SiCN layer) is nitrided in step 4, the element C may be maintained at a higher content than the element N, and a SiCN layer having a high C concentration may be formed. That is, a SiCN film having a high C concentration may be formed.

[Step 4] (Supply of $NH_3$ Gas)

After step 3 ends and the gas remaining in the process chamber 201 is eliminated, the valve 243d of the fourth gas supply pipe 232d is opened to supply $NH_3$ gas into the fourth gas supply pipe 232d. The flow rate of the $NH_3$ gas flowing in the fourth gas supply pipe 232d is adjusted by the MFC 241d. The $NH_3$ gas, the flow rate of which is adjusted, is supplied from the gas supply holes 250d of the fourth nozzle 249d into the buffer chamber 237. In this case, without applying RF power between the first rod electrode 269 and the second rod electrode 270, the $NH_3$ gas supplied into the buffer chamber 237 is activated (excited) with heat, supplied into the process chamber 201, and exhausted from the exhaust pipe 231 (refer to FIG. 9A). Also, by applying RF power via the matching unit 272 from the RF power source 273 between the first and second rod electrodes 269 and 270, the $NH_3$ gas supplied into the buffer chamber 237 is activated (excited) with plasma, supplied as an active species from the gas supply holes 250e into the process chamber 201, and exhausted from the exhaust pipe 231 (refer to FIG. 9B). In this case, $NH_3$ gas activated with heat or plasma is supplied onto the wafer 200. At the same time, the valve 243h is opened to supply $N_2$ gas into the inert gas supply pipe 232h. The $N_2$ gas is supplied into the process chamber 201 together with the $NH_3$ gas and exhausted from the exhaust pipe 231.

Also, in this case, in order to prevent the $O_2$ gas from flowing into the first through third nozzles 249a to 249c, the valves 243e to 243g are opened to supply $N_2$ gas into the first through third inert gas supply pipes 232e to 232g. The $N_2$ gas is supplied into the process chamber 201 via the first through third gas supply pipes 232a to 232c and the first through third nozzles 249a to 249c, and exhausted from the exhaust pipe 231.

When the $NH_3$ gas is activated not with plasma but with heat and supplied, the pressure in the process chamber 201 is set to be within, for example, a range of 1 to 3,000 Pa by appropriately controlling the APC valve 244. By setting the pressure in the process chamber 201 to be within a relatively high pressure range, the $NH_3$ gas may be thermally activated using a non-plasma process within the fourth nozzle 249d, the buffer chamber 237, or the process chamber 201. Also, when the $NH_3$ gas is activated with heat and supplied, a soft reaction may be caused to softly perform a nitridation action which will be described below. Also, when the $NH_3$ gas is activated with plasma and supplied as active species ($NH_3^*$), i.e., plasma excited species, the pressure in the process chamber 201 is set to be within, for example, a range of 1 to 100 Pa by appropriately controlling the APC valve 244. A supply flow rate of the $NH_3$ gas controlled by the MFC 241d is set, for example, to be within a range of 100 to 10,000 sccm. The supply flow rates of the $N_2$ gas controlled by the MFCs 241h, 241e, 241f, and 241g are set, for example, to be within a range of 100 to 10,000 sccm. In this case, when the $NH_3$ gas is activated with heat and supplied, a partial pressure of the $NH_3$ gas in the process chamber 201 is set to be within a range of, for example, 0.01 to 2,970 Pa. Also, when the $NH_3$ gas is activated with plasma and supplied, a partial pressure of the $NH_3$ gas in the process chamber 201 is set to be within a range of, for example, 0.01 to 99 Pa. A duration for which the $NH_3$ gas activated with heat or the active species obtained by activating the $NH_3$ gas with plasma is supplied onto the wafer 200, i.e., a gas supply time (gas irradiation time), is set to range, for example, from 1 to 120 seconds, and preferably 1 to 60 seconds. In this case, similar to steps 1 through 3, the temperature of the heater 207 may be set such that the temperature of the wafer 200 is within a range of 250 to 700° C., preferably a range of 300 to 650° C., and more preferably a range of 350 to 600° C. When the $NH_3$ gas is activated with plasma, RF power applied from the RF power source 273 between the first and second rod electrodes 269 is set to be within a range of, for example, 50 to 1,000 W.

In this case, the gas supplied into the process chamber 201 is $NH_3$ gas thermally activated by elevating the pressure in the process chamber 201 or an active species obtained by activating $NH_3$ gas with plasma, and none of HCDS gas, 3DMAS gas, and TEA gas is supplied into the process chamber 201. Accordingly, the $NH_3$ gas does not cause a vapor reaction, and the activated $NH_3$ gas or the active species of the $NH_3$ gas reacts with at least a portion of the second layer (SiCN layer) formed on the wafer 200 in step 3. Thus, the second layer is nitrided and modified into a third layer. The third layer is a silicon carbonitride (SiCN layer) richer in N than the second layer and also has a lower content of impurities than the second layer.

As shown in FIG. 9A, by activating $NH_3$ gas with heat and supplying the activated $NH_3$ gas into the process chamber 201, the second layer may be thermally nitrided and modified (changed) into a SiCN layer having a low content of impurities. In this case, the second layer is modified into the SiCN layer having a low content of impurities while increasing a content of the element N in the second layer. Also, due to energy of nitrided species (a thermal nitridation action using $NH_3$ gas), Si—N bonds increase in the second layer, while Si—C bonds and Si—Si bonds are reduced in the second layer, and a content of each of the elements C and Si contained in the second layer is reduced. Impurities such as Cl remaining in the second layer are desorbed due to the energy of nitrided species and removed as HCl or $NH_4Cl$. That is, the second layer may be modified into a SiCN layer having a low content of impurities while varying a content ratio toward increasing a N concentration and reducing C and Si concentrations. Also, by controlling process conditions, such as a pressure in the process chamber 201 or a gas supply time, a content of the element N (i.e., a N concentration) of the SiCN layer may be finely adjusted, and a content ratio of the SiCN layer may be controlled more precisely.

As shown in FIG. 9B, active species obtained by activating $NH_3$ gas with plasma are supplied into the process chamber 201, so that the second layer may be plasma-nitrided and modified (changed) into a SiCN layer having a low content of impurities. In this case, the second layer is modified into the SiCN layer having a low content of impurities while increasing a content of the element N in the second layer. Also, due to energy of nitrided species, i.e., plasma excited species (a plasma nitridation action using $NH_3$ gas), Si—N bonds increase in the second layer, while Si—C bonds and Si—Si bonds are reduced in the second layer, and a content of each of the elements C and Si contained in the second layer is reduced. Impurities such as Cl remaining in the second layer are desorbed due to the energy of plasma excited species and removed as HCl or $NH_4Cl$. That is, the second layer may be modified into a SiCN layer having a low content of impurities while varying a content ratio toward increasing a N concentration and reducing C and Si concentrations. Also, by controlling process conditions, such as a pressure in the process chamber 201 or a gas supply time, a content of the element N (i.e., a N concentration) of the SiCN layer may be finely adjusted, and a content ratio of the SiCN layer may be controlled more precisely.

A nitridation reaction of the second layer is preferably not saturated. For example, when the second layer is formed to a thickness of several atomic layers in step 1 through step 3, a portion of the second layer is preferably nitrided. In this case, nitridation is performed under conditions in which the nitridation reaction of the second layer is unsaturated, so as not to nitride the entire second layer having a thickness of several atomic layers.

Although process conditions of step 4 may be set as described above to cause the nitridation reaction of the second layer to be unsaturated, the process conditions of step 4 may be set to be the following process conditions so that the nitridation reaction of the second layer can be easily unsaturated.

[When $NH_3$ Gas is Activated with Heat and Supplied]
Wafer temperature: 500 to 600° C.
Pressure in the process chamber: 133 to 2,666 Pa
$NH_3$ gas partial pressure: 33 to 2,515 Pa
$NH_3$ gas supply flow rate: 1,000 to 5,000 sccm
$N_2$ gas supply flow rate: 300 to 3,000 sccm
$NH_3$ gas supply time: 6 to 60 seconds
[When $NH_3$ Gas is Activated with Plasma and Supplied]
Wafer temperature: 500 to 600° C.
Pressure in the process chamber: 33 to 80 Pa
$NH_3$ gas partial pressure: 8 to 75 Pa
$NH_3$ gas supply flow rate: 1,000 to 5,000 sccm
$N_2$ gas supply flow rate: 300 to 3,000 sccm
$NH_3$ gas supply time: 6 to 60 seconds
(Removing of Remnant Gas)

After the third layer is formed on the wafer 200, the valve 243d of the fourth gas supply pipe 232d is closed and the supply of the $NH_3$ gas is stopped. In this case, the inside of the process chamber 201 is vacuum-exhausted by the vacuum pump 246 while the APC valve 244 of the exhaust pipe 231 is open, thereby eliminating the $NH_3$ gas (that does not react or that has contributed to the formation of the third layer) or byproducts remaining in the process chamber 201 from the process chamber 201. In this case, $N_2$ gas is continuously supplied as an inert gas into the process chamber 201 while the valves 243e to 243h are open. The $N_2$ gas acts as a purge gas to increase the effect of eliminating the $NH_3$ gas (that does not react or that has contributed to the formation of the third layer) or byproducts remaining in the process chamber 201 from the process chamber 201.

In this case, the gas remaining in the process chamber 201 may not be completely eliminated and the inside of the process chamber 201 may not be completely purged. When a small amount of gas remains in the process chamber 201, step 1 to be performed thereafter will not be badly influenced by the gas. In this case, the flow rate of the $N_2$ gas to be supplied into the process chamber 201 need not be high. For example, the inside of the process chamber 201 may be purged without causing step 1 to be badly influenced by the gas by supplying an amount of a gas corresponding to the capacity of the reaction tube 203 (process chamber 201). As described above, when the inside of the process chamber 201 is not completely purged, a purge time may be reduced to improve the throughput. Furthermore, the consumption of the $N_2$ gas may be suppressed to a necessary minimum level.

As the nitrogen-containing gas, not only the gas obtained by activating $NH_3$ gas with heat or plasma but also a gas obtained by activating diazene ($N_2H_2$) gas, hydrazine ($N_2H_4$) gas, $N_3H_8$ gas, etc., with heat or plasma may be used. As the nitrogen-containing gas, a gas obtained by diluting the gases described above with a rare gas, such as Ar gas, He gas, Ne gas, Xe gas, etc., and activating the diluted gas with heat or plasma may be used.

(Performing a Cycle a Predetermined Number of Times)

A silicon carbonitride (SiCN) film having a predetermined composition may be formed on the wafer 200 to a predetermined thickness by performing a cycle including steps 1 to 4 described above at least once (a predetermined number of times). The cycle described above is preferably performed a plurality of times. That is, a thickness of a SiCN layer to be formed per cycle may be set to be less than a desired thickness and the cycle may be performed a plurality of times until the SiCN film may have the desired thickness. Also, the SiCN film may be referred to as a thin film containing silicon (Si), carbon (C), and nitrogen (N).

A SiCN film having a predetermined composition may be formed on the wafer 200 to a predetermined thickness by performing, a predetermined number of times, a cycle including a process of alternately performing step 1 and step 2 described above a predetermined number of times, a process of performing step 3, and a process of performing step 4. That is, a SiCN film may be formed on the wafer 200 to a predetermined thickness by performing, a predetermined number of times, a cycle including a process of performing, a predetermined number of times, a set including step 1 and step 2 described above, a process of performing step 3, and a process of performing step 4.

By performing, a predetermined number of times, a cycle including a process of performing a set including step 1 and step 2 described above a predetermined number of times, a process of performing step 3, and a process of performing step 4, the controllability of a content ratio of the SiCN film may be improved. That is, absolute quantities of the elements Si, N, and C of the first layer may be increased or decreased by increasing or reducing the number of times the set is performed. Then, the first layer in which the absolute quantity of each element may be increased or decreased is modified in step 3 and step 4. Thus, a content of each element of the SiCN layer may be adjusted by the number of times the set is performed, so that a content of each element of a finally formed SiCN film can be controlled by the number of times the set is performed.

By increasing the number of times the set including step 1 and step 2 is performed, the number of layers of the first layer to be formed per cycle, i.e., the thickness of the first layer to be formed per cycle, may be increased as much as the number of times the set is performed, and it becomes possible to increase a cycle rate (the thickness of the SiCN layer to be formed per unit cycle). Thus, a film forming rate (film thickness of the SiCN film to be formed per unit time) may also be improved.

A SiCN film may be formed on the wafer 200 to a predetermined thickness by performing, a predetermined number of times, a cycle including a process of performing a set including step 1 through step 3 described above and a process of performing step 4.

By performing, a predetermined number of times, the cycle including the process of performing a set including step 1 through step 3 described above a predetermined number of times and the process of performing step 4, the controllability of a content ratio of the SiCN film may be improved. That is, absolute quantities of the elements Si, N, and C of the second layer may be increased or decreased by increasing or reducing the number of times the set is performed. Then, the second layer in which the absolute quantity of each element may be increased or decreased is modified in step 4. Thus, a content of each element of the SiCN layer may be adjusted by the number of times the set is performed, so that a content of each element of a finally formed SiCN film can be controlled by the number of times the set is performed.

By increasing the number of times the set including step 1 through step 3 is performed, the number of layers of the second layer to be formed per cycle, i.e., the thickness of the second layer to be formed per cycle, may be increased as much as the number of times the set is performed, and it becomes possible to increase a cycle rate (the thickness of the SiCN layer to be formed per unit cycle). Thus, a film forming rate (film thickness of the SiCN film to be formed per unit time) may also be improved.

When a film forming process of forming a SiCN film having a predetermined composition to a predetermined thickness is performed, a gas purging process, an inert gas replacement process, an atmospheric pressure recovery process, a boat unloading process, and a wafer discharge process are performed in the same manner as in the first sequence.

According to the present embodiments, when an insulating film is formed using a chlorosilane-based source or aminosilane-based source, a silicon insulating film having a desired composition with a high Si density may be formed. Also, a silicon insulating film having an ideal stoichiometric ratio may be formed. According to experiments by the inventors, when only a chlorosilane-based source was used, in a temperature range of 500° C. or less, it was difficult to deposit silicon on a wafer at a film forming rate that satisfied production efficiency. When only an aminosilane-based source was used, deposition of silicon on a wafer was not confirmed in a temperature range of 500° C. or less. However, according to a method of the present embodiments, a high-quality silicon insulating film may be formed at a film forming rate that satisfies production efficiency even in a low temperature range of 500° C. or less.

When a film is formed at a low temperature, kinetic energy of molecules is generally lowered. Thus, it becomes difficult to cause a reaction/desorption of chlorine (Cl) included in a chlorosilane-based source or amine included in an aminosilane-based source, and ligands of chlorine or an amine remain on a surface of the wafer. Silicon is prevented from being adsorbed on the surface of the wafer due to steric hindrance of the remaining ligands of chlorine and an amine. Thus, silicon density is reduced, and the film is degraded. However, even under the conditions hindering the reaction/desorption, the remaining ligands of chlorine and an amine may be desorbed by appropriately reacting two silane sources, i.e., a chlorosilane-based source and an aminosilane-based source, with each other. The steric hindrance of the remaining ligands is eliminated due to the desorption thereof. Thus, silicon may be adsorbed on an open site, and silicon density may be elevated. Therefore, it is inferred that a film having a high silicon density may be formed in a low temperature range of 500° C. or less.

According to the present embodiments, after a first layer containing Si, N, and C, i.e., a silicon insulating layer, is formed on a wafer by supplying a chlorosilane-based source and then supplying an aminosilane-based source, an amine-based source is supplied. Thus, a N concentration or C concentration of the silicon insulating layer may be appropriately adjusted, and a silicon insulating layer having desired characteristics may be formed while controlling a content ratio.

According to the present embodiments, after a first layer containing Si, N, and C, i.e., a silicon insulating layer, is formed on a wafer by supplying a chlorosilane-based source and then supplying an aminosilane-based source, an amine-based source is supplied, and an oxidizing gas or nitriding gas is then supplied. Thus, a N concentration, C concentration, or O concentration of the silicon insulating layer may be appropriately adjusted, and a silicon insulating layer having desired characteristics may be formed while controlling a content ratio.

According to the present embodiments, a pressure in a process chamber when an amine-based source is supplied may be set to be higher than pressures in the process chamber when a chlorosilane-based source, an aminosilane-based source, and a reactive gas are supplied. Also, the pressure in the process chamber when the reactive gas is supplied may be set to be higher than the pressures in the process chamber when the chlorosilane-based source and the aminosilane-based source are supplied, and the pressure in the process chamber when the amine-based source is supplied may be set to be higher than the pressure in the process chamber when the reactive gas is supplied. By adjusting the pressure in the process chamber as described above, a second layer (SiCN layer) richer in C may be formed. Thus, after the second layer (SiCN layer) is oxidized or nitrided, the element C may be maintained at a higher content than the element N, and a SiOCN film, SiOC film, or SiCN film having a high C concentration may be formed.

According to the present embodiments, a cycle including a process of performing a set including step 1 and step 2 a predetermined number of times and a process of performing step 3 may be performed a predetermined number of times (first sequence). Also, a cycle including a process of performing a set including step 1 and step 2 a predetermined number of times, a process of performing step 3, and a process of performing step 4 may be performed a predetermined number of times (second and third sequences). Furthermore, a cycle including a process of performing a set including step 1, step 2, and step 3 a predetermined number of times and a process of performing step 4 may be performed a predetermined number of times (second and third sequences). By performing a film forming process using these sequences, a N concentration, C concentration, or O concentration of a silicon insulating film (SiOCN film, SiOC film, or SiCN film) may be appropriately controlled, and the controllability of a content ratio of the silicon insulating film may be improved. Also, a cycle rate may be improved, and a film forming rate may also be improved. A silicon insulating film having a different content ratio may be formed in the direction of the thickness of the film by varying the number of times the set is performed during each cycle. For example, a silicon insulating film having a composition in which a N concentration, C concentration, or O concentration may gradually increase in the film thickness direction (depthwise direction) or a silicon insulating film having a composition in which the N concentration, C concentration, or O concentration may gradually decrease in the film thickness direction (depthwise direction) may be formed.

A technique of forming a device having a leak current and high processability may be provided by using a silicon insulating film formed according to the present embodiments as sidewall spacers.

A technique of forming a device having high processability may be provided by using a silicon insulating film formed according to the present embodiments as an etch stopper.

According to the present embodiments, a silicon insulating film having an ideal stoichiometric ratio may be formed without using plasma in a low-temperature range. Since the silicon insulating film may be formed without using plasma, a film forming process may be adjusted to a process which is likely to cause plasma damage, such as double patterning technology (DPT) of forming a self-aligned double patterning (SADP) film.

In the previous embodiments, a case in which a chlorosilane-based source and an aminosilane-based source are sequentially supplied onto the wafer 200 contained in the process chamber 201 to form the first layer containing Si, N, and C in each sequence has been described, but the sources may be supplied in a reversed sequence. That is, the aminosilane-based source may be supplied and then the chlorosilane-based source may be supplied. That is, one of the chlorosilane-based source and the aminosilane-based source may be first supplied and then the other source may be supplied. Also, a process of supplying one of the chlorosilane-based source and the aminosilane-based source and a process of supplying the other source may be alternately performed a predetermined number of times. As described above, the quality or content ratio of a thin film to be formed in each sequence may be changed by changing the sequence in which the sources are supplied.

The film or content ratio of a thin film to be formed in each sequence may be changed by changing not only a sequence in which the chlorosilane-based source and the aminosilane-based source are supplied but also a sequence in which all gases including the chlorosilane-based source and the aminosilane-based source are supplied.

In the previous embodiments, a case in which a chlorosilane-based source and an aminosilane-based source are used to form a first layer containing Si, N, and C in each sequence has been described, but a silane-based source having ligands containing a halogen group other than the chlorosilane-based source may be used instead of the chlorosilane-based source. For example, a fluorosilane-based source may be used instead of the chlorosilane-based source. Here, the fluorosilane-based source is a silane-based source containing a fluoro group and a source containing at least silicon (Si) and fluorine (F). For example, a silicon fluoride gas, such as $SiF_4$ gas or $Si_2F_6$ gas, may be used as a fluorosilane-based source gas. In this case, when a first layer containing Si, N, and C is formed in each sequence, a fluorosilane-based source and an aminosilane-based source are sequentially supplied onto the wafer 200 contained in the process chamber 201, the aminosilane-based source and the fluorosilane-based source are sequentially supplied onto the wafer 200 contained in the process chamber 201, or these supply processes are alternately performed a predetermined number of times.

In the previous embodiments, although a case in which plasma is used in step 4 of the third sequence has been described, plasma may be used in each step of other sequences. For example, by activating each gas in each step of each of the sequences to generate plasma and supplying the plasma, each layer may be modified using plasma nitridation (nitrogen doping), plasma carbonization (carbon doping), or plasma oxidation (oxygen doping). However, the use of plasma is not suitable for a process which is likely to cause plasma damage, but preferably applicable to other processes which are unlikely to cause plasma damage.

A hydrogen-containing gas (reducing gas) may be supplied together with an oxygen-containing gas in the step of supplying the oxygen-containing gas. When the oxygen-containing gas and the hydrogen-containing gas are supplied into the process chamber 201 under a sub-atmospheric pressure (reduced pressure), the oxygen-containing gas and the hydrogen-containing gas react with each other in the process chamber 201 to generate an oxidized species containing $H_2O$-free oxygen, such as atomic oxygen (O), and each layer may be oxidized by the oxidized species. In this case, an oxidation process may be performed with higher oxidizing power than when only the oxygen-containing gas is used. The oxidation process may be performed in a non-plasma reducing-pressure atmosphere. For example, hydrogen ($H_2$) gas or deuterium ($D_2$) gas may be used as the hydrogen-containing gas (reducing gas).

Also, in the previous embodiments, a case in which a chlorosilane-based source is supplied onto the wafers 200 contained in the process chamber 201 and then an aminosilane-based source is supplied onto the wafers 200 to form a first layer containing Si, N, and C in each of the sequences has been described above. However, a CVD reaction may be caused to occur by simultaneously supplying the chlorosilane-based source and the aminosilane-based source onto the wafers 200 contained in the process chamber 201. In this case, process conditions may be set to be the same as those in each of the sequences described in the previous embodiments. As described above, the effects according to the previous embodiments may also be derived even when the chlorosilane-based source gas and the aminosilane-based source gas are not sequentially supplied but simultaneously supplied onto the wafers 200 contained in the process chamber 201. However, as in the previous embodiments, when the chlorosilane-based source gas and the aminosilane-based source gas are alternately supplied and the inside of the process chamber 201 is purged between supply of the chlorosilane-based source gas and supply of the aminosilane-based source gas, the chlorosilane-based source gas and the aminosilane-based source gas can be appropriately reacted under a condition causing a surface reaction to be dominant, and the controllability of the thickness of a thin film may be improved.

In the previous embodiments, a case in which one kind of thin film (single film) is formed on a wafer in a process chamber in each sequence at once has been described. Also, a stacked film including at least two thin films may be formed on the wafer in the process chamber at once by appropriately combining the respective sequences described above. For example, a stacked film obtained by alternately stacking a SiCN film and a SiOCN film or SiOC film may be formed by alternately performing the sequence of FIG. 4 and the sequence of FIG. 5 in the process chamber in-situ. Also, for example, a stack film obtained by alternately stacking a SiOCN film or SiOC film and a SiCN film may be formed by alternately performing the sequence of FIG. 5 and the sequence of FIG. 6 in the process chamber in-situ.

As described above, the present invention is preferably applied to not only forming a single film but also forming a stacked film. In this case, the effects according to the previous embodiments may also be derived.

In the previous embodiments, an example in which a silicon-based insulating film containing silicon as a semiconductor element is formed as a thin film has been described, the present invention may be applied to a case in which a metal-based thin film containing a metal element, such as titanium (Ti), zirconium (Zr), hafnium (Hf), tantalum (Ta), aluminum (Al), or molybdenum (Mo), is formed.

For example, the present invention may be applied to a case in which a titanium carbonitride (TiCN) film, a titanium oxycarbonitride (TiOCN) film, a titanium oxycarbide (TiOC) film, a Ti-based thin film formed of a combination or mixture thereof, or a stacked film thereof is formed.

For example, the present invention may be applied to a case in which a zirconium carbonitride (ZrCN) film, a zirconium oxycarbonitride (ZrOCN) film, a zirconium oxycarbide (ZrOC) film, a Zr-based thin film formed of a combination or mixture thereof, or a stacked film thereof is formed.

For example, the present invention may be applied to a case in which a hafnium carbonitride (HfCN) film, a hafnium oxycarbonitride (HfOCN) film, a hafnium oxycarbide (HfOC) film, a Hf-based thin film formed of a combination or mixture thereof, or a stacked film thereof is formed.

For example, the present invention may be applied to a case in which a tantalum carbonitride (TaCN) film, a tantalum oxycarbonitride (TaOCN) film, a tantalum oxycarbide (TaOC) film, a Ta-based thin film formed of a combination or mixture thereof, or a stacked film thereof is formed.

For example, the present invention may be applied to a case in which an aluminum carbonitride (AlCN) film, an aluminum oxycarbonitride (AlOCN) film, an aluminum oxycarbide (AlOC) film, an Al-based thin film formed of a combination or mixture thereof, or a stacked film thereof is formed.

For example, the present invention may be applied to a case in which a molybdenum carbonitride (MoCN) film, a molybdenum oxycarbonitride (MoOCN) film, a molybdenum oxycarbonitride (MoOC) film, a Mo-based thin film formed of a combination or mixture thereof, or a stacked film thereof is formed.

In this case, a film forming process may be performed according to the same sequences as in the previous embodiments using a source (first source) containing a metal element and a chloro group instead of a chlorosilane-based source described in the previous embodiments and using a source (second source) containing a metal element and an amino group instead of an aminosilane-based source described in the previous embodiments.

For example, when the first sequence described in the previous embodiments is applied to a process of forming a metal-based thin film, a metal carbonitride film having a predetermined composition is formed on a wafer 200 to a predetermined thickness by alternately performing, a predetermined number of times, a process of alternately supplying a first source containing a metal element and a chloro group and a second source containing a metal element and an amino group onto the wafer 200 contained in a process chamber 201 to form a first layer containing a metal element, nitrogen (N), and carbon (C) on the wafer 200; and a process of modifying the first layer by supplying an amine-based source onto the wafer 200 contained in the process chamber 201 to form a metal carbonitride layer as a second layer.

When the second sequence described in the previous embodiments is applied to a process of forming a metal-based thin film, a metal oxycarbonitride film or metal oxycarbide film having a predetermined composition is formed on a wafer 200 to a predetermined thickness by performing, a predetermined number of times, a cycle including: a process of alternately supplying a first source containing a metal element and a chloro group and a second source containing a metal element and an amino group onto the wafer 200 contained in a process chamber 201 to form a first layer containing a metal element, nitrogen (N), and carbon (C) on the wafer 200; a process of modifying the first layer by supplying an amine-based source onto the wafer 200 contained in the process chamber 201 to form a metal carbonitride layer as a second layer; and a process of oxidizing the second layer by supplying an oxygen (O)-containing gas (oxidizing gas) activated with heat onto the wafer 200 contained in the process chamber 201 to form a metal oxycarbonitride layer or metal oxycarbide layer as a third layer.

When the third sequence described in the previous embodiments is applied to a process of forming a metal-based thin film, a metal carbonitride film having a predetermined composition is formed on a wafer 200 to a predetermined thickness by performing, a predetermined number of times, a cycle including: a process of alternately supplying a first source containing a metal element and a chloro group and a second source containing a metal element and an amino group onto the wafer 200 contained in a process chamber 201 to form a first layer containing a metal element, nitrogen (N), and carbon (C) on the wafer 200; a process of modifying the first layer by supplying an amine-based source onto the wafer 200 contained in the process chamber 201 to form a metal carbonitride layer; and a process of nitriding the second layer by supplying a nitrogen-containing gas (nitriding gas) activated with heat or plasma onto the wafer 200 contained in the process chamber 201 to form a metal carbonitride layer as a third layer.

In the present disclosure, the expression 'a first source containing a metal element and a chloro group and a second source containing the metal element and an amino group are alternately supplied' should be understood to mean both of a case in which a set including a process of supplying one of the first source containing the metal element and the chloro group and the second source containing the metal element and the amino group onto the wafer 200 contained in the process chamber 201 and a process of supplying the other of the first and second sources onto the wafer 200 contained in the process chamber 201 is performed once and a case in which the set is repeated a plurality of times. That is, it means that the set is performed at least once (a predetermined number of times).

For example, when a titanium (Ti) thin film is formed as a metal-based thin film, a source containing Ti and a chloro group, such as titanium tetrachloride ($TiCl_4$), may be used as a first source, and a source containing Ti and an amino group, such as tetrakis ethylmethylamino titanium ($Ti[N(C_2H_5)(CH_3)]_4$, abbreviated as TEMAT), tetrakis dimethylamino titanium ($Ti[N(CH_3)_2]_4$, abbreviated as TDMAT), and tetrakis diethylamino titanium ($Ti[N(C_2H_5)_2]_4$, abbreviated as TDEAT), may be used as a second source. The same gases as in the previous embodiments may be used as an amine-based source, an oxygen-containing gas, or a nitrogen-containing gas. In this case, process conditions may be set to be the same as those in the previous embodiments.

For example, when a zirconium (Zr)-based thin film is formed as a metal-based thin film, a source containing Zr and a chloro group, such as zirconium tetrachloride ($ZrCl_4$), may be used as a first source, and a source containing Zr and an amino group, such as tetrakis ethylmethylamino zirconium ($Zr[N(C_2H_5)(CH_3)]_4$, abbreviated as TEMAZ), tetrakis dimethylamino zirconium ($Zr[N(CH_3)_2]_4$, abbreviated as TDMAZ), or tetrakis diethylamino zirconium ($Zr[N(C_2H_5)_2]_4$, abbreviated as TDEAZ), may be used as a second source. The same gases as in the previous embodiments may be used as an amine-based source, an oxygen-containing gas, or a nitrogen-containing gas. In this case, process conditions may be set to be the same as those in the previous embodiments.

For example, when a hafnium (HO-based thin film is formed as a metal-based thin film, a source containing Hf and a chloro group, such as hafnium tetrachloride ($HfCl_4$), may be used as a first source, and a source containing Hf and an amino group, such as tetrakis ethylmethylamino hafnium ($Hf[N(C_2H_5)(CH_3)]_4$, abbreviated as TEMAH), tetrakis dimethylamino hafnium ($Hf[N(CH_3)_2]_4$, abbreviated as TDMAH), or tetrakis diethylamino hafnium ($Hf[N(C_2H_5)_2]_4$, abbreviated as TDEAH), may be used as a second source. The same gases as in the previous embodiments may be used as an amine-based source, an oxygen-containing gas, or a nitrogen-containing gas. In this case, process conditions may be set to be the same as those in the previous embodiments.

As described above, the present invention may be applied to not only forming a silicon-based thin film but also forming a metal-based thin film. In this case, the effects according to the previous embodiments may also be derived.

That is, the present invention may be applied to forming a thin film containing a predetermined element, such as a semiconductor element or a metal element.

In the previous embodiments, cases in which a thin film is formed using a batch-type substrate processing apparatus capable of processing a plurality of substrates at once have been described above. However, the present invention is not limited thereto and is preferably applicable to a case in which a thin film is formed using a single-wafer substrate processing apparatus capable of processing one or several substrates at once.

An appropriate combination of the embodiments, film forming sequences, modified examples, and applied examples described above may be used.

The present invention may be embodied by changing, for example, a process recipe of a conventional substrate processing apparatus. When the process recipe is changed, a process recipe according to the present invention may be installed in the conventional substrate processing apparatus via an electric communication line or a recording medium on which the process recipe is recorded. Alternately, the process recipe of the conventional substrate processing apparatus may be changed into the process recipe according to the present invention by manipulating an input/output (I/O) device of the conventional substrate processing apparatus.

Exemplary embodiments of the present invention will be supplementarily described below.

(Supplementary Note 1)

According to one aspect of the present invention, there is provided a method of manufacturing a semiconductor device, the method including forming a thin film having a predetermined composition and containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

Here, alternately performing the process of supplying the first source gas and the process of supplying the second source gas a predetermined number of times includes performing a set including a process of supplying one of the first source gas and the second source gas and a process of supplying the other thereof once and repeating the set a plurality of times. That is, it means that the set is performed at least once (a predetermined number of times).

In addition, performing the cycle including the process of forming the first layer, the process of forming the second layer, and the process of forming the third layer a predetermined number of times includes performing the cycle once and repeating the cycle a plurality of times. That is, it means performing the cycle at least once (a predetermined number of times).

In the present specification, the same expressions as described above have the same meanings as described above.

(Supplementary Note 2)

The method of Supplementary note 1, wherein an inside pressure of the process chamber when supplying the amine-based source gas is higher than that of the process chamber when supplying the first source gas, the second source gas and the reactive gas.

(Supplementary Note 3)

The method of Supplementary note 2, wherein the inside pressure of the process chamber when supplying the amine-based source gas is higher than that of the process chamber when supplying the reactive gas, and the inside pressure of the process chamber when supplying the reactive gas is higher that of the process chamber when supplying the first source gas and the second source gas.

(Supplementary Note 4)

The method of Supplementary note 3, wherein the third layer includes an oxycarbonitride layer or an oxycarbide layer formed by supplying an oxidizing gas as the reactive gas to the substrate in the step of forming the third layer, and the thin film includes an oxycarbonitride film or an oxycarbide film.

(Supplementary Note 5)

The method of Supplementary note 3, wherein the third layer includes a carbonitride layer formed by supplying a nitriding gas as the reactive gas to the substrate in the step of forming the third layer, and the thin film includes a carbonitride film.

(Supplementary Note 6)

According to another aspect of the present invention, there is provided a method of processing a substrate, the method including forming a thin film having a predetermined composition and containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

(Supplementary Note 7)

According to still another aspect of the present invention, there is provided a substrate processing apparatus including:

a process chamber configured to accommodate a substrate;

a first source gas supply system configured to supply a first source gas containing a predetermined element and a halogen group to the substrate in the process chamber;

a second source gas supply system configured to supply a second source gas containing the predetermined element and an amino group to the substrate in the process chamber;

a third source gas supply system configured to supply an amine-based source gas to the substrate in the process chamber;

a reactive gas supply system configured to supply a reactive gas different from the first source gas, the second source gas and the amine-based source gas to the substrate in the process chamber; and a controller configured to control the first source gas supply system, the second source gas supply system, the third source gas supply system and the reactive gas supply system to form a thin film having a predetermined composition and containing the predetermined element on the substrate by performing a cycle a predetermined number of times, the cycle including: forming a first layer containing the predetermined element, nitrogen and carbon on the substrate by alternately performing a predetermined number of times: supplying the first source gas to the substrate in the process chamber; and supplying the second source gas to the substrate in the process chamber; forming a second layer by modifying the first layer by supplying the amine-based source gas to the substrate in the process chamber; and forming a third layer by modifying the second layer by supplying the reactive gas to the substrate in the process chamber.

(Supplementary Note 8)

According to yet another aspect of the present invention, there is provided a program that causes a computer to perform: forming a thin film having a predetermined composition containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

(Supplementary Note 9)

According to yet another aspect of the present invention, there is provided a non-transitory computer-readable recording medium storing a program that causes a computer to perform: forming a thin film having a predetermined composition containing a predetermined element on a substrate by performing a cycle a predetermined number of times, the cycle including:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber.

The invention claimed is:

1. A method of manufacturing a semiconductor device, the method comprising forming a thin film having a predetermined composition and containing a predetermined element on a substrate by performing a cycle a predetermined number of times, the cycle comprising:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber, wherein an inside pressure of the process chamber when supplying the amine-based source gas is higher than inside pressures of the process chamber when supplying the first source gas, the second source gas and the reactive gas.

2. The method of claim 1, wherein the inside pressure of the process chamber when supplying the amine-based source gas is higher than that of the process chamber when supplying the reactive gas, and the inside pressure of the process chamber when supplying the reactive gas is higher than that of the process chamber when supplying the first source gas and the second source gas.

3. The method of claim 2, wherein the third layer comprises an oxycarbonitride layer or an oxycarbide layer formed by supplying an oxidizing gas as the reactive gas to the substrate in the step of forming the third layer, and the thin film comprises an oxycarbonitride film or an oxycarbide film.

4. The method of claim 2, wherein the third layer comprises a carbonitride layer formed by supplying a nitriding gas as the reactive gas to the substrate in the step of forming the third layer, and the thin film comprises a carbonitride film.

5. A method of processing a substrate, the method comprising forming a thin film having a predetermined composition and containing a predetermined element on a substrate by performing a cycle a predetermined number of times, the cycle comprising:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber, wherein an inside pressure of the process chamber when supplying the amine-based source gas is higher than inside pressures of the process chamber when supplying the first source gas, the second source gas and the reactive gas.

6. A non-transitory computer-readable recording medium storing a program that causes a computer to perform:

forming a thin film having a predetermined composition and containing a predetermined element on a substrate by performing a cycle a predetermined number of times, the cycle comprising:

forming a first layer containing the predetermined element, nitrogen and carbon on the substrate by alternately performing a predetermined number of times: supplying a first source gas containing the predetermined element and a halogen group to the substrate in a process chamber; and supplying a second source gas containing the predetermined element and an amino group to the substrate in the process chamber;

forming a second layer by modifying the first layer by supplying an amine-based source gas to the substrate in the process chamber; and forming a third layer by modifying the second layer by supplying a reactive gas different from the first source gas, the second source gas and the amine-based source gas to the substrate in the process chamber, wherein an inside pressure of the process chamber when supplying the amine-based source gas is higher than inside pressures of the process chamber when supplying the first source gas, the second source gas and the reactive gas.

* * * * *